United States Patent
Eitschberger et al.

(10) Patent No.: US 11,733,016 B2
(45) Date of Patent: Aug. 22, 2023

(54) PRESSURE BULKHEAD STRUCTURE WITH INTEGRATED SELECTIVE ELECTRONIC SWITCH CIRCUITRY

(71) Applicant: DynaEnergetics Europe GmbH, Troisdorf (DE)

(72) Inventors: Christian Eitschberger, Munich (DE); Thilo Scharf, Letterkenny (IE)

(73) Assignee: DynaEnergetics Europe GmbH, Troisdorf (DE)

( * ) Notice: Subject to any disclaimer, the term of this patent is extended or adjusted under 35 U.S.C. 154(b) by 322 days.

(21) Appl. No.: 17/075,781

(22) Filed: Oct. 21, 2020

(65) Prior Publication Data
US 2021/0033375 A1    Feb. 4, 2021

Related U.S. Application Data

(63) Continuation of application No. 16/194,440, filed on Nov. 19, 2018, now Pat. No. 10,845,178, which is a
(Continued)

(51) Int. Cl.
*E21B 43/11* (2006.01)
*F42D 1/05* (2006.01)
(Continued)

(52) U.S. Cl.
CPC ............ *F42D 1/05* (2013.01); *E21B 43/1185* (2013.01); *F42D 1/045* (2013.01); *H05K 5/0034* (2013.01);
(Continued)

(58) Field of Classification Search
CPC ........... E21B 43/1185; E21B 43/11857; E21B 43/11; E21B 17/003; E21B 17/028; F42D 1/05
See application file for complete search history.

(56) References Cited

U.S. PATENT DOCUMENTS 2,252,270 A    8/1941  Miller
2,934,625 A    4/1960  Patrichi
(Continued)

FOREIGN PATENT DOCUMENTS

CA    3038451 A1    3/2018
CN    201218089     4/2009
(Continued)

OTHER PUBLICATIONS

Canadian Intellectual Property Office; Office Action for CA Application No. 3058827; dated Dec. 16, 2020; 5 pages.
(Continued)

*Primary Examiner* — Cathleen R Hutchins
(74) *Attorney, Agent, or Firm* — Womble Bond Dickinson (US) LLP

(57) ABSTRACT

Pressure-isolating bulkhead structures with integrated selective electronic switches circuitry are provided. The pressure-isolating bulkhead structure may be a single unit having the integrated electronic switch circuitry, as well as an electrical connector that includes at least one of a wire and a pin contact. Such integrated selective electronic switch circuitry may be fashioned within a self-contained, inner pressure-isolating enclosure body. Such inner pressure-isolating enclosure body may be produced about the selective electronic switch circuitry such that the inner pressure-isolating enclosure body and switch circuitry are produced as a unit, which can be easily placed within a variety of bulkhead structures, and subsequently within a perforating gun.

19 Claims, 10 Drawing Sheets

Related U.S. Application Data continuation of application No. 15/950,453, filed on Apr. 11, 2018, now Pat. No. 10,161,733.

(60) Provisional application No. 62/553,483, filed on Sep. 1, 2017, provisional application No. 62/515,178, filed on Jun. 5, 2017, provisional application No. 62/505,365, filed on May 12, 2017, provisional application No. 62/486,903, filed on Apr. 18, 2017.

(51) Int. Cl.
*E21B 43/1185* (2006.01)
*H05K 5/06* (2006.01)
*H05K 5/00* (2006.01)
*H05K 5/02* (2006.01)
*F42D 1/045* (2006.01)
*E21B 43/117* (2006.01)

(52) U.S. Cl.
CPC ......... *H05K 5/0056* (2013.01); *H05K 5/0065* (2013.01); *H05K 5/0069* (2013.01); *H05K 5/0247* (2013.01); *H05K 5/069* (2013.01); *E21B 43/117* (2013.01); *H05K 5/064* (2013.01); *H05K 5/065* (2013.01)

(56) References Cited

U.S. PATENT DOCUMENTS

| | | | |
|---|---|---|---|
| 3,010,396 A | 11/1961 | Coleman | |
| 3,173,992 A | 3/1965 | Boop | |
| 3,208,378 A | 9/1965 | Boop | |
| 3,246,707 A | 4/1966 | Bell | |
| 3,302,269 A | 2/1967 | Cooper et al. | |
| 3,327,792 A | 6/1967 | Boop | |
| 3,474,198 A | 10/1969 | Conrad | |
| 3,648,785 A | 3/1972 | Walker | |
| 4,007,796 A | 2/1977 | Boop | |
| 4,100,978 A | 7/1978 | Boop | |
| 4,234,768 A | 11/1980 | Boop | |
| 4,246,457 A | 1/1981 | Teichert et al. | |
| 4,266,613 A | 5/1981 | Boop | |
| 4,339,638 A | 7/1982 | Lascelles et al. | |
| 4,457,383 A | 7/1984 | Boop | |
| 4,598,776 A | 7/1986 | Stout | |
| 4,637,131 A | 1/1987 | Ochsner | |
| 4,763,519 A | 8/1988 | Comeau | |
| 5,027,708 A | 7/1991 | Gonzalez et al. | |
| 5,237,136 A | 8/1993 | Langston | |
| 5,316,087 A | 5/1994 | Manke et al. | |
| 5,347,929 A | 9/1994 | Lerche et al. | |
| 5,483,895 A | 1/1996 | Tomek et al. | |
| 5,908,365 A | 6/1999 | LaJaunie et al. | |
| 6,095,258 A | 8/2000 | Reese et al. | |
| 7,360,487 B2 | 4/2008 | Myers, Jr. et al. | |
| 7,364,451 B2 | 4/2008 | Ring et al. | |
| 7,461,580 B2 | 12/2008 | Bell et al. | |
| 7,902,469 B2 | 3/2011 | Hurst | |
| 8,369,063 B2 | 2/2013 | Vicente | |
| 8,387,533 B2 | 3/2013 | Runkel | |
| 8,704,524 B2 | 4/2014 | Jones et al. | |
| 8,710,385 B2 | 4/2014 | Sickels | |
| 8,875,787 B2 | 11/2014 | Tassaroli | |
| 8,875,796 B2 | 11/2014 | Hales et al. | |
| 8,967,291 B2 | 3/2015 | Bonavides et al. | |
| 8,973,675 B2 | 3/2015 | Herrera | |
| 8,978,817 B2 | 3/2015 | Rodgers et al. | |
| 9,080,433 B2 | 7/2015 | Lanclos et al. | |
| 9,145,764 B2 | 9/2015 | Burton et al. | |
| 9,194,219 B1 | 11/2015 | Hardesty et al. | |
| 9,291,040 B1 | 3/2016 | Hardesty et al. | |
| 9,334,715 B2 | 5/2016 | Bonavides et al. | |
| 9,598,951 B2 | 3/2017 | Mueller et al. | |
| 9,752,421 B2 | 9/2017 | LaGrange et al. | |
| 9,890,620 B2 | 2/2018 | Maxted et al. | |
| 10,161,733 B2 | 12/2018 | Eitschberger et al. | |
| 10,180,050 B2 | 1/2019 | Hardesty | |
| 10,845,178 B2 | 11/2020 | Eitschberger et al. | |
| 11,047,216 B2 | 6/2021 | Hardesty et al. | |
| 2009/0272529 A1 | 11/2009 | Crawford | |
| 2009/0301723 A1 | 12/2009 | Gray | |
| 2010/0051440 A1 | 3/2010 | Hurst | |
| 2010/0085210 A1 | 4/2010 | Bonavides et al. | |
| 2010/0208408 A1 | 8/2010 | Love et al. | |
| 2010/0286800 A1 | 11/2010 | Lerche et al. | |
| 2012/0199352 A1 | 8/2012 | Lanclos et al. | |
| 2012/0247769 A1* | 10/2012 | Schacherer | E21B 43/117 166/63 |
| 2012/0250208 A1 | 10/2012 | Love et al. | |
| 2012/0255842 A1 | 10/2012 | Runkel | |
| 2013/0043074 A1 | 2/2013 | Tassaroli | |
| 2013/0104764 A1* | 5/2013 | Metcalfe | F42D 1/05 102/206 |
| 2013/0126237 A1 | 5/2013 | Burton et al. | |
| 2013/0199843 A1 | 8/2013 | Ross | |
| 2013/0291751 A1 | 11/2013 | Sickels | |
| 2013/0327514 A1 | 12/2013 | Bonavides et al. | |
| 2014/0083718 A1 | 3/2014 | Bell | |
| 2014/0260591 A1 | 9/2014 | Rodgers et al. | |
| 2015/0000509 A1 | 1/2015 | Current et al. | |
| 2016/0070554 A1 | 3/2016 | Lewis et al. | |
| 2016/0215597 A1 | 7/2016 | LaGrange et al. | |
| 2016/0237794 A1 | 8/2016 | Maxted et al. | |
| 2016/0245055 A1 | 8/2016 | Hardesty et al. | |
| 2016/0273902 A1 | 9/2016 | Eitschberger | |
| 2016/0333676 A1 | 11/2016 | Hardesty | |
| 2017/0009560 A1 | 1/2017 | Wells | |
| 2018/0135389 A1 | 5/2018 | Sullivan | |
| 2018/0299239 A1 | 10/2018 | Eitschberger et al. | |
| 2018/0313194 A1 | 11/2018 | Hardesty et al. | |
| 2019/0309609 A1 | 10/2019 | Hardesty et al. | |
| 2020/0063537 A1 | 2/2020 | Langford et al. | |
| 2020/0225014 A1 | 7/2020 | Maxted et al. | |

FOREIGN PATENT DOCUMENTS

| | | |
|---|---|---|
| CN | 202141073 U | 2/2012 |
| CN | 104481469 A | 4/2015 |
| CN | 205036356 U | 2/2016 |
| CN | 205400694 U | 7/2016 |
| EP | 0257155 B1 | 1/1991 |
| GB | 2544247 A | 5/2017 |
| RU | 2287669 C2 | 11/2006 |
| WO | 2016133550 A1 | 8/2016 |
| WO | 2018022200 A1 | 2/2018 |

OTHER PUBLICATIONS

The State Intellectual Property Office of P.R. China; Office Action for CN Application No. 201880025701.7; dated Feb. 2, 2021; 10 pages.

Canadian Intellectual Property Office; Notice of Allowance for CA Application No. 3,058,827; dated May 28, 2021; 1 page.

United States Patent and Trademark Office; Non-Final Office Action for U.S. Appl. No. 16/449,519; dated Jan. 19, 2021; 20 pages.

United States Patent and Trademark Office; Notice of Allowance for U.S. Appl. No. 16/449,519; dated Mar. 8, 2021; 8 pages.

China National Intellectual Property Administration; Office Action for CN Application No. 201880025701.7; dated Sep. 27, 2021; 3 pages.

Albert, Larry et al.; New Perforating Switch Technology Advances Safety & Reliability for Horizontal Completions; HydraFrac2015-3851; Mar. 17-19, 2015; 16 pgs.

Albert, Larry et al.; New Perforating Switch Technology Advances Safety & Reliability for Horizontal Completions; Unconventional Resources Tech. Conference; Jul. 20-22, 2015; 7 pgs.

Allied Horizontal; Advancing Plug-and-Perf Safety and Reliability; Jul. 2015; 2 pgs; http://alliedhorizontal.com/wireline-services/perforating-services/.

Dynaenergetics, DynaSelect System, Jul. 2016, 6 pages http://www.dynaenergetics.com/uploads/files/56e6f94760245_Product_Brochures_DynaSelect_OnlineView.pdf.

(56) References Cited

OTHER PUBLICATIONS

Federal Institute for Industrial Property; Inquiry for RU App No. 2019136666/03(072399); Jun. 17, 2020; 7 pages (English translation 5 pages).
Guardian; Select Fire Switch; May 20, 2015; 2 pgs.; http://www.ggtg.net/guardian-product.php?prod=SFS&prodid=79&cat-bds.
Hunting; Control Fire; Jun. 2013; 20 pgs.; http://www.hunting-intl.com/.
Hunting; EBFire Guide Book; Jan. 28, 2015; 23 pgs; http://www.hunting-intl.com/media/361239/ebfire_guide_book.pdf.
International Searching Authority; International Search Report and Written Opinion for PCT App No. PCT/EP2018/059531; dated Sep. 19, 2018; 14 pages.
Longe, Kevin; Boom Times; Winter 2016 DynaEnergetics brochure; Nov. 21, 2016; 3 pgs.
United States Patent and Trademark Office; Non-final Office Action for U.S. Appl. No. 16/194,440; dated Mar. 3, 2020; 10 pages.
United States Patent and Trademark Office; Notice of Allowance for U.S. Appl. No. 16/194,440; dated Jul. 21, 2020; 5 pages.
USPTO, Notice of Allowance for U.S. Appl. No. 15/950,453, dated Oct. 4, 2018, 7 pgs.

\* cited by examiner

PRESSURE BULKHEAD STRUCTURE WITH INTEGRATED SELECTIVE ELECTRONIC SWITCH CIRCUITRY

CROSS-REFERENCE TO RELATED APPLICATIONS

This application is a continuation of U.S. application Ser. No. 16/194,440, filed Nov. 19, 2018, which is a continuation of U.S. application Ser. No. 15/950,453 filed Apr. 11, 2018 which claims the benefit of U.S. Provisional Application No. 62/553,483 filed Sep. 1, 2017, U.S. Provisional Application No. 62/515,178 filed Jun. 5, 2017, U.S. Provisional Application No. 62/505,365 filed May 12, 2017, and U.S. Provisional Application No. 62/486,903 filed Apr. 18, 2017, each of which is incorporated herein by reference in its entirety.

FIELD

The present disclosure relates generally to pressure bulkhead structures for use in perforating guns and perforating gun select fire sub assemblies/systems, the types of which are used for perforating wellbores of oil and natural gas wells. More specifically, the present disclosure relates to pressure isolating bulkhead structures for containing an electronic component, as well as individual structural components of such bulkheads.

BACKGROUND

Perforating guns are commonly used to convey and detonate explosive substances (shaped charges) within wellbores, with the ultimate objective of achieving a hydraulic connection with sought-after deposits of oil and/or natural gas within and/or adjacent to permeable reservoir rocks. Once a promising drilling location has been identified, the creation of wells typically begins with the boring of a hole (i.e. borehole) to reach sought-after deposits of oil and/or natural gas. To prevent collapse of the borehole, a cylindrical casing may be inserted into the borehole. In many situations, cement is pumped into a more or less annular space between the cylindrical casing and the larger cylindrical hole wall to mechanically stabilize the well. While this method improves the stability of the wellbore, it also isolates the inner portions of the casing and the wellbore from the sought-after deposits of oil and/or natural gas.

A perforating gun employs a detonator/initiator and explosive components, which are typically lowered into the casing of the borehole via a wireline or tubing. Operators of the perforating gun at the surface of the wellbore may convey and/or retrieve the gun, or more specifically a series of perforating gun modules. The perforating guns may be conveyed to desired depths within a wellbore in order to detonate explosives to create perforations in the casing, the surrounding cement walls of the wellbore, and the surrounding geological formations. Such perforating gun systems may be used in vertical, deviated, or horizontal borehole shafts. Such perforating gun designs often include structures to protect internal operational components of the gun from the potentially damaging temperatures, vibrations, shock impact, pressures, and fluid-containing environments found within a wellbore, until the actual detonation of explosives occurs. In traditional selectively initiated perforating gun assemblies/systems, the devices include housings, also known as select fire subs, which include pressure bulkheads, which enclose/isolate components such as the pin assemblies, separate detonators, and shaped explosive charges.

Examples of perforating guns, their components, and systems which employ such guns are described in U.S. Pat. No. 9,494,021 to Parks et al., U.S. Pat. No. 9,145,764 to Burton et al., and U.S. Pat. No. 9,080,433 to Lanclos et al., each of which are incorporated by reference in their entireties. For the purposes of this application, a perforating gun select fire sub assembly is considered a component of the larger "perforating gun" apparatus. The perforating gun select fire sub assembly often includes the pressure bulkhead structure for housing a firing pin assembly, and other internal components, such as pass-through wiring.

As noted, perforating gun system designs frequently utilize pressure-isolating housing components or bulkhead structures within their select fire sub assemblies for isolating/protecting individual gun modules/components from one another along a chain of gun modules. Such pressure-isolating structures help to prevent inadvertent detonation or detonation interference as a result of exposure to wellbore fluid, pressure, or other conditions of the surrounding wellbore environment. Such pressure-isolating bulkheads may house simple-electrical feed-through or mechanical switches, which enable detonation of the next gun in a line of sequential gun modules.

Use of simple electrical or mechanical switches may mean that only one gun module is electrically connected at any one time to the controller at the wellbore surface, and a specific sequence of events must occur in order to initiate each gun module in a sequence of gun modules. Specifically, the gun modules of these systems are typically detonated from the lowest-most gun module (or end-most gun module farthest from the controller at the surface) to the highest gun module (closest to the controller). An interruption in the firing sequence of sequential gun modules (whether by failure of the simple electrical or mechanical switch) means that an entire firing operation would need to be aborted, adding much cost and time delay to a completion operation. Further, the fact that only one gun module is electrically connected at any one time means that the entire gun string cannot be pre-tested and/or verified to be functional and correctly assembled. Gun failure can only be found when it is too late in the completion operation and the gun operator may not be fully confident that the entire system will eventually work as desired.

In order to provide more reliability and safety to perforating gun assemblies/systems, selective electronic switches have been developed for placement within various components of perforating structures, such as those offered by DynaEnergetics GmbH & Co. KG under the brand DYNASELECT® system, which incorporates a selective electronic switch within a detonator. Such selective electronic switches may include the DYNAENERGETICS® Selectronic Switch. While effective in providing detonation reliability and higher safety levels (i.e. avoiding inadvertent detonation from stray voltage fluctuations or intense RF frequencies which may be common around wellbore operations) such components may add material cost for the operators of such systems when compared to simpler diode type switch systems. Even more advances have been set out in commonly assigned U.S. patent application Ser. No. 15/499,439, entitled "Electronic Ignition Circuit and Method for Use," filed Apr. 27, 2017, which is incorporated by reference in its entirety.

Others have disclosed arrangements for employing electronic switches in retainer means, for retaining components of a perforating gun within the tubular gun structure. Such specific retainer devices, as those described in U.S. Pat. No. 9,291,040 to Hardesty et al., which is incorporated by reference in its entirety, require that distinct retainers (i.e. threaded pieces) be employed in a perforating gun assembly, thereby imparting potential equipment-specific limitations on operators of such systems. Depending on particular design features, such retainer devices may also expose contained circuitry to environmental conditions of the surrounding wellbore (especially if they are not sufficiently electrically isolated or protected from the wellbore), thereby compromising the reliability or effectiveness of such switches during operation.

It should also be noted that the previously described pressure bulkhead structures of select fire sub assemblies may contain void spaces within their structures. As a result, vibrations, shock-impact, or jarring movement associated with the conveying (pump-down operation) or retrieving of the equipment, or from detonation of gun modules in close proximity on a wireline, can cause components within the pressure bulkhead structures to shift about or contacts to be damaged, potentially leading to a misfire event or damage to the components that may be housed within such pressure bulkhead structures. Such damage may occur even if the components have some fixed connection at one end of the pressure bulkhead.

In view of the disadvantages associated with currently available switching devices for detonating perforating gun modules, there is a need for selective electronic switching devices (and associated circuit boards) which may be easily employed within a long string of perforating gun modules, where the switching devices provide protection from vibrations and environmental conditions of the wellbore. There is a further need for switching devices that may be easily placed within a variety of industry standard gun module equipment design formats, without requiring specific retention constructions.

BRIEF DESCRIPTION

This generally describes a pressure bulkhead structure of a perforating gun select fire sub assembly. The pressure bulkhead structure includes a pressure isolating structure having a pressure isolating enclosure body. The pressure isolating enclosure body includes a sealed first end, a sealed second end, and an elongated body portion that extends between the sealed first and second ends. According to an aspect, the pressure bulkhead structure includes a selective electronic switch circuitry that is positioned between the sealed first end and the sealed second end. The selective electronic switch circuitry may be immovable/secured and sealed within the pressure-isolating enclosure body, so that it is isolated from surrounding environmental conditions, such as the wellbore temperature and fluid/moisture, electrical charge variations, and physical shocks. An electrical connector, a wiring arrangement and a common ground contact may extend from the selective electronic switch circuitry. The electrical connector may be one of a wire and a pin contact. In an embodiment, the electrical connector extends from the selective electronic switch circuitry through the sealed first end, while the wiring arrangement and the common ground contact both extend from the selective electronic switch circuitry through the sealed second end.

This disclosure further describes pressure-isolating structures for use with a pressure bulkhead of a perforating gun select fire sub assembly. According to an aspect, the pressure-isolating enclosure includes an inner pressure-isolating enclosure for placement within a pressure bulkhead structure. As described hereinabove in relation with the pressure-isolating enclosure, the inner pressure-isolating enclosure includes an inner pressure-isolating enclosure body having a sealed first end, a sealed second end, and an elongated body portion that extends between the sealed first and second ends and is positioned between the inner pressure-isolating enclosure body. The inner pressure-isolating enclosure may include a selective electronic switch circuitry positioned within the inner pressure-isolating enclosure body and adjacent an inner edge of the inner pressure-isolating body. The selective electronic switch circuitry may be positioned inward from the sealed first and second ends of the inner pressure-isolating enclosure body, such that the selective electronic switch circuitry is spaced apart from the sealed first and second ends. A pin contact may extend from the selective electronic switch circuitry through the sealed first end, and a wiring arrangement may extend from the selective electronic switch circuitry through the sealed second end. According to an aspect, a common ground contact extends from the selective electronic switch circuitry through the sealed second end. The selective electronic switch circuitry may be arranged within the inner pressure-isolating enclosure so that it is immovable and sealed within the inner pressure-isolating enclosure body.

The disclosure further describes a pressure bulkhead structure for placement in a select fire sub assembly of a perforating gun module. The pressure bulkhead structure may enclose a down hole facing pin assembly, and form a pressure-isolating chamber between sequential perforating gun modules. According to an aspect, the pressure bulkhead structure includes an inner pressure-isolating enclosure substantially as described hereinabove, and an outer pressure-isolating enclosure including a conductive material. The outer pressure-isolating enclosure may include a first end and a second end, the first end surrounding a pin assembly. According to an aspect, the outer pressure isolating enclosure includes an outer wall edge, and an inner wall edge that defines an interior cavity. The pressure bulkhead structure may also include a selective electronic switch circuitry positioned within the inner pressure-isolating enclosure body, the selective electronic switch circuitry. A pin contact may be attached to and extend from the selective electronic switch circuitry, while also partially extending through the sealed first end to make electrical contact with the pin assembly located outside the inner pressure-isolating enclosure body. According to an aspect, the pressure bulkhead structure includes a wiring arrangement and a common ground contact, both attached to and extending from the selective electronic switch circuitry, and partially extending through the sealed second end. The wiring arrangement provides electrical communication connection between the selective electronic switch circuitry and other components outside of the inner pressure-isolating enclosure body, and the common ground contact makes electrical contact with the conductive material of the outer pressure isolating enclosure, either directly or indirectly.

The present disclosure further relates to pressure bulkhead structures, substantially as described hereinabove, for incorporation into a select fire sub assembly of a perforating gun.

BRIEF DESCRIPTION OF THE FIGURES

A more particular description will be rendered by reference to specific embodiments thereof that are illustrated in the appended drawings. Understanding that these drawings depict only typical embodiments thereof and are not therefore to be considered to be limiting of its scope, exemplary embodiments will be described and explained with additional specificity and detail through the use of the accompanying drawings in which.

Figure 1A:
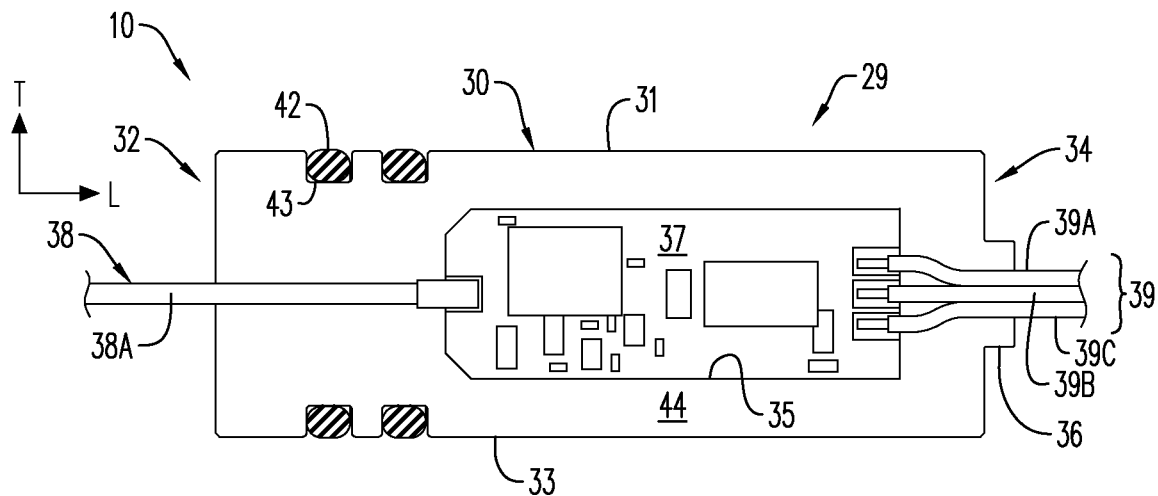
FIG. 1A is a top, partial cross-sectional view of a pressure bulkhead structure with an integrated selective electronic switch circuitry, according to an embodiment.

Various features, aspects, and advantages of the embodiments will become more apparent from the following detailed description, along with the accompanying figures in which like numerals represent like components throughout the figures and text. The various described features are not necessarily drawn to scale, but are drawn to emphasize specific features relevant to some embodiments.

DETAILED DESCRIPTION

Reference will now be made in detail to various embodiments. Each example is provided by way of explanation, and is not meant as a limitation and does not constitute a definition of all possible embodiments.

The terms "pressure bulkhead" and "pressure bulkhead structure" shall be used interchangeably, and shall refer to an internal, perforating gun housing compartment of a select fire sub assembly. In an embodiment, it also contains a pin assembly and allows the electrical passage of a wiring arrangement. The bulkhead structures may include at least one electrically conductive material within its overall structure.

The term "pressure-isolating" shall refer to the capacity of a structural component to withstand influence of at least pressure from all sides of a surrounding environment. The pressure-isolating capacity may be imparted by one or more of a variety of design techniques. For example, the shape and/or construction of the structural component itself (such as the housing shape, or housing manufacturing method) may protect components housed within a component from external environmental pressure/as well as other deleterious environmental conditions. The use of additional features such as O-rings or other seals with the component (such as surrounding or immediately adjacent a housing) may also protect structures housed therein from influence of external pressures. Alternatively, protection from outside pressures may be accomplished through specific enclosure-manufacturing techniques which seal within the body of the housing/enclosure, solid state electronics, and which also provide seals around an extending pin or wire contact, wire arrangement, and ground contact feature which may extend from the solid state electronics to locations outside the enclosure/housing. Alternatively, such protection from external pressures may be imparted by two or more design techniques, such as a combination of two or more aspects selected from shape, manufacturing/construction techniques, and use of secondary features (as with the use of one or more O-rings).

The term "integrated" shall refer to selective electronic switch circuitry and/or a selective electronic switch circuit board that is tightly enclosed, encased, or bonded to a surrounding enclosure, housing, or body, such that it is not easily separated from the immediately surrounding enclosure, housing, or body, without at least minimal destruction of the selective electronic switch circuitry or parts thereof. For example, an integrated selective electronic switch circuitry (solid state electronics) would be one that is adhesively fastened to, press-fitted into, or otherwise immovably bonded or attached to an immediately surrounding enclosure, housing, or body, and which may easily be damaged upon attempted separation from the enclosure, housing, or surrounding body. The attachment makes the solid state electronics immoveable or practically immoveable within the enclosure, housing, or surrounding body. For example, a surrounding enclosure, housing, or body may be directly injection molded about, extruded about, coated about, 3-D printed about, or otherwise closely situated about the solid state electronics of a selective electronic switch circuit board or one or more edges of the circuit board, such that removal of the surrounding enclosure, housing, or body would be destructive to the selective electronic switch circuit board or structures thereon. The methods of manufacture may also act to seal the solid state electronics from exposure to harmful external environmental factors. The integrated selective electronic switch circuitry may be bonded to a surrounding housing, enclosure or body by being bonded on all surfaces to the surrounding housing, enclosure, or body, or alternatively, by being bonded along one or more of six sides/surfaces of a three-dimensional circuit board. The bonding of the integrated selective electronic switch circuitry may occur on either 1, 2, 3, 4, 5, or 6 sides/surfaces of a three dimensional circuit board (such as a rectangular circuit board). The circuit board may be for example, a traditional circuit board including a planar board-like structure with circuit components or micro-processor chips printed or otherwise mounted thereon.

The term "selective electronic circuit board" shall be used interchangeably with "selective electronic switch circuit board" and "selective electronic switch circuitry" and shall refer to a solid state electronic switch circuitry which may be addressed from an inactivated state, to an activated state by the action of an operator at a remote location, and desirably by an action in which the switch circuitry is addressed via a specific electronic, digital, or wavelength-type control signal. The selective electronic switch circuit board/circuitry includes microprocessor technology. In an embodiment, the selective electronic switch circuitry contemplated will not need to be selected or addressed in a particular sequence within a perforating gun assembly, and the addressing of the selective electronic switch circuitry will not be dependent on the prior addressing of a physically adjacent selective electronic switch circuitry in an immediately adjacent perforating gun module. The term selective electronic switch circuit board/circuitry shall for the purposes of this application, not encompass the term "pin contact" for communicating with pin firing assemblies and which might physically extend out from a selective electronic switch circuitry, or a "wiring arrangement" for directing power, communications and ground functionality to other components of a perforating gun select fire sub assembly, and which might extend out from a selective electronic switch circuitry, or a "common ground contact," which might extend out from the selective electronic switch circuitry, and which is designed to provide a general ground for the solid state electronics making up the selective electronic switch circuitry.

The term "sealed" shall for the purposes of this disclosure, mean protection from detrimental influence of surrounding environmental conditions. Such protection shall include at least, protection from differences in pressure. In other embodiments, such protection may also include protection from one or more of temperature differences, fluid/moisture differences, electrical charge variations, and physical shocks. While connections between structural elements described in this disclosure and the enclosures themselves are sealed, particular emphasis has been provided with respect to certain connections and enclosures in order to emphasize this point. For example, while described enclosures may include internal elements, which extend through walls/edges of the enclosures, it should be understood that those internal elements (such as pin contacts, common ground contacts, ground arms, and wiring arrangements) extend outward from the enclosures through otherwise sealed regions of the enclosures (and without compromising the body seals). Their extension outward through the edges/walls does not negatively impact the seal maintained by such connection or enclosure.

The disclosed pressure bulkhead structure, with integrated selective electronic switch circuitry, provides structural protection for sensitive electronics so as to more easily allow the assembly and use of perforating gun assemblies having significantly safer and more reliable detonation technology. Similarly, the disclosed inner pressure-isolating enclosure for specifically housing an integrated selective electronic switch circuit board and related circuitry, also provides structural protection to the board and circuitry. By integrating selective electronic switch circuitry technology within a pressure bulkhead structure or, in some embodiments, within an internal component of a pressure bulkhead structure that is itself contained within the outer housing of the pressure bulkhead structure, rather than as part of other gun assembly components (or separated switch circuitry designs), the selective electronic switch circuitry technology may be protected from both the jarring movements encountered while conveying such assemblies into/through a well-bore, the jarring movements encountered while detonating adjacent assemblies, and from the surrounding deleterious conditions of a wellbore itself.

For purposes of illustrating features of the embodiments, simple examples will now be introduced and referenced throughout the disclosure. Those skilled in the art will recognize that these examples are illustrative and not limiting and are provided purely for explanatory purposes. As other features of a perforating gun assembly are generally known (such as detonator and shaped charge design structures), for ease of understanding of the current disclosure those other features will not be otherwise described herein except by reference to other publications as may be of assistance.

Figure 1B:
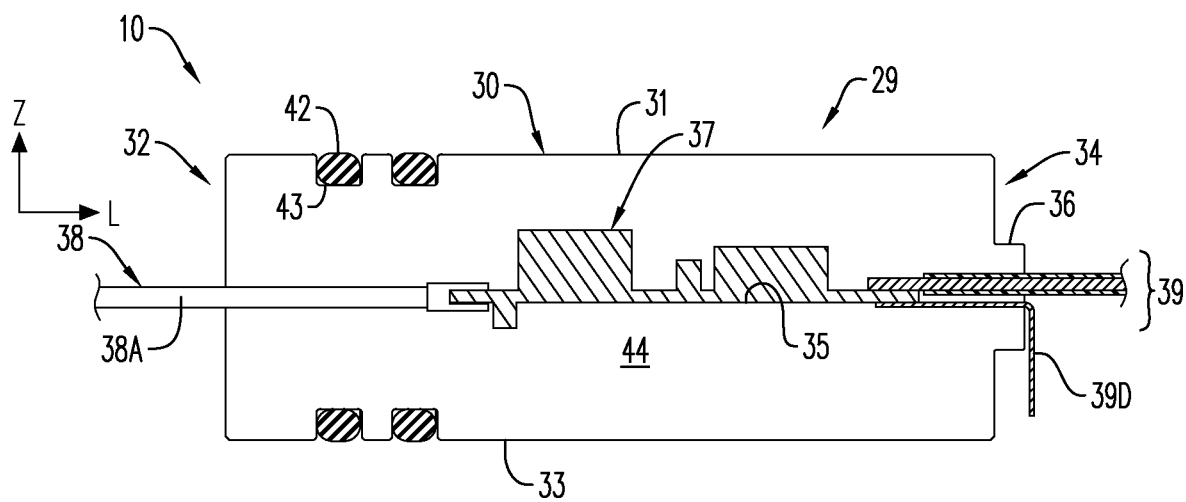
FIG. 1B a side, partial cross-sectional view of the pressure bulkhead structure of FIG. 1A.

Turning now to the figures, FIGS. 1A and 1B illustrate an exemplary pressure bulkhead structure 10. The pressure bulkhead structure 10 may be used in a select fire sub assembly of a perforating gun (not shown). The pressure bulkhead structure 10 includes a pressure-isolating enclosure 29 having a pressure-isolating enclosure body 30 that surrounds/encases a selective electronic switch circuitry 37.

According to an aspect, the pressure-isolating enclosure body 30 is formed about the selective electronic switch circuitry 37 so that there are no spatial gaps between the pressure-isolating enclosure body 30 and the selective electronic switch circuitry 37. In an embodiment, the pressure-isolating enclosure body 30 is formed from at least one of a polymeric material, a thermoplastic material, and an elastomeric material. The pressure-isolating enclosure body 30 may be formed of a rigid material, such as a rigid thermoplastic. Examples of thermoplastic materials useful to form the pressure-isolating enclosure body 30 (and other components as will be discussed hereinbelow), may include polyethylene (PE), polypropylene (PP), polycarbonate (PC), polyvinyl chloride (PVC), polystyrene (PS), nylon (aka polyamide (PA)), polyester (typically polyethylene terephthalate (PET)), polyalkelene glycol (PAG) with or without glass fiber, polyetheretherketone (PEEK), or silicone. These materials are available as a homopolymer, co-polymer or reinforced. Examples of useful nylon include nylon 6 (PA6), nylon 66 (PA66), nylon 6/6-6, nylon 6/9, nylon 6/10, nylon 6/12, nylon 11, nylon 12. Nylons may also be blended with other engineering plastics to improve certain aspects of performance. Nylon is well suited for processing via injection molding, rotational molding, or casting. Useful polyethylene compounds include high density polyethylene (HDPE), low density polyethylene (LPDE) and linear low density polyethylene (LLPDE). According to an aspect, the glass fibers are present in an amount of about 15% to about 30% of the total weight (mass) of PAG. Alternatively, the pressure-isolating enclosure body 30 is made of a conformable or gel-like material, which demonstrates some elasticity when slightly depressed. Such elasticity may provide additional shock resistance for solid state electrical analog or digital components contained, housed, or otherwise enclosed by the pressure-isolating enclosure body 30. In an embodiment, the pressure-isolating enclosure body 30 encases the selective electronic switch circuitry (circuit board) 37 so that it comes in contact with all outer surfaces of the selective electronic circuit board 37, rather than merely be bonded to its outer perimeter side edges (such as, along one or more of the four side edges of a rectangular circuit board supporting circuit/microprocessor components).

In an embodiment, the pressure-isolating enclosure body 30 is constructed of a singular material. The pressure-isolating enclosure body 30 may be constructed so that no manufacturing seams are present within or along the pressure-isolating enclosure body 30. The pressure-isolating enclosure body 30 may be injection-molded over the selective electronic switch circuitry, potted, or alternatively, 3D-printed over the selective electronic switch circuitry 37, in order to provide a desired seal that protects the selective electronic switch circuitry 37 from potentially detrimental influence of surrounding environmental conditions, such as those of the wellbore.

While we have generally described that the pressure-isolating enclosure body 30 may be formed of a singular material through, for instance, an injection-molded process, given the sensitivity of the solid state electronics of the selective electronic switch circuit board 37, it is contemplated that a two-step injection molding process may be used to form the pressure-isolating enclosure body 30. The pressure-isolating enclosure body 30 may be formed from two different materials. In an embodiment, the pressure-isolating enclosure body 30 includes a first/inner layer of injection molding material adjacent the selective electronic switch circuit board 37, and a second/outer layer of injection molding material adjacent the first layer. The first layer may be formed from any injection molding material having a melting temperature of less than about 180° C. The first layer completely covers the selective electronic switch circuit board 37, and any active and passive components mounted onto any of its surfaces, so that the components are protected from the surrounding environmental conditions on the wellbore. When the injection molding material forming the first layer is heated above its melting temperature, it essentially takes the form of a liquid and is able to conform to the shape of the selective electronic switch circuit board 37 and the solid state electronics and/or the active and passive components mounted thereto. According to an aspect, the first layer of injection molding material completely fills any gaps or spaces on the circuit board 37, as well as spaces between the components of the selective electronic switch circuit board 37. The first layer of injection molding material may function as a substrate for the outer layer of injection molding material, so that the outer layer is affixed to or extends from the first layer. In an embodiment, the first layer includes a PE compound, such as, HDPE, LPDE, and LLPDE. Alternatively, the first layer may be formed from PP, PE and the like. The second layer is positioned adjacent the first layer, and provides additional structural strength to the pressure-isolating enclosure body 30. According to an aspect, the second layer of injection molding material is directly connected to or integrally formed with the first layer, so that the first and second layers cannot be easily separated from each other. The second layer is formed from a high strength injection molding material having a melting temperature of at least about 300° C. According to an aspect, the outer layer includes PA6, PA66, PET and the like. The second layer helps to insulate the first layer and the encased selective electronic switch circuit board 37, as well as the solid state electronics and/or the active and passive components, from the high temperatures of the wellbore.

The pressure-isolating enclosure body 30 includes a sealed first end 32 and a sealed second end 34. In an embodiment, the pressure-isolating enclosure body 30 is of a generally cylindrical shape, having an elongated body portion 31. The elongated body portion 31 extends between the sealed first end 32 and the sealed second end 34 along a longitudinal direction L of the enclosure body 30, and the selective electronic switch circuitry 37 is generally centrally disposed within the elongated body portion 31. The pressure-isolating enclosure body 30 further includes an outer circumference, and one or more O-rings 42 are positioned about the outer circumference. According to an aspect, and as illustrated in FIGS. 1A and 1B, the O-rings 42 are each positioned in a circumferential groove 43 formed in an outer edge 33 of the pressure-isolating enclosure body 30. The circumferential groove 43 may be depressions that extend around the outer circumference of the pressure-isolating enclosure body 30, and help retain the O-rings 42 in a desired location.

As described hereinabove, the pressure bulkhead structure 10 includes a selective electronic switch circuitry 37 that is encased within the pressure-isolating enclosure body 30. The pressure-isolating enclosure body 30 and selective electronic switch circuitry 37 form an integrated/self-contained modular unit for use with various bulkhead structure designs. Such integrated modular unit allows for the use of a selective electronic switch circuitry without the need to incorporate circuitry directly with detonators and/or other format-specific components of a perforating gun.

As seen in FIGS. 1A and 1B, the selective electronic circuitry 37 includes a circuit board (in phantom) on which circuit components are positioned. The selective electronic switch circuitry 37 may be constructed of any known circuit board construction materials, as would be understood by one of ordinary skill in the art. The selective electronic switch circuitry 37 is immune to RF frequencies and/or unwanted direct and indirect stray voltage and stray current. The selective electronic switch circuitry 37 is encased within the pressure-isolating enclosure body 30 and positioned between the sealed first and second ends 32, 34, so that it is immovable and sealed therein. The sealed first and second ends 32, 34 of the body 30 prevent external pressure or environmental conditions of the wellbore from impacting the selective electronic switch circuitry 37.

The pressure bulkhead structure 10 includes an electrical connector 38, which extends from the selective electronic switch circuitry 37. At least a portion of the electrical connector 38 is sealed within the pressure-isolating enclosure body 30, with another portion extending through the sealed first end 32 of the elongated body portion 31 of the pressure-isolating enclosure body 30. The electrical connector 38 may be one of a wire (or wire electrical connector)

38A and a pin contact 38B. As seen for instance in FIGS. 1A and 1B, the wire electrical connector 38A is electrically connected to (i.e., in electrical communication with) the selective electronic switch circuitry 37. The wire electrical connector 38A or the pin contact 38B may be a down hole facing connector that provides an electrical connection to an adjacent perforating gun module. It is also contemplated that the pressure bulkhead structure 10 may enclose a down hole facing pin assembly 50 (see, for instance, FIG. 4). As seen for instance in FIGS. 4-5, 8B, 8C and 8D, the electrical connector 38 may be arranged so that it is adjacent the down hole facing pin assembly 50.

The pressure bulkhead structure 10 may also include a wiring arrangement 39 and a common ground contact 39D, which each extend from the selective electronic switch circuitry 37 along the longitudinal direction L of the enclosure body 30, and through the sealed second end 34. The wiring arrangement 39 may have a three-wire arrangement, which includes an outwardly directed detonator power line 39A (i.e., line-out), a detonator ground line 39B (i.e., ground), and a communications line 39C (i.e., line-in or hot wire). The arrangement and materials selected to form the common ground contact 39D enables the common ground contact 39D to make electrical contact, directly or indirectly, with the select fire sub assembly of the perforating gun. As illustrated in FIGS. 1A and 1B, a collar 36 extends from the sealed second end 34. The common ground contact 39D may wrap about the collar/edge 36 of the sealed second end 34 (as seen, for instance, in FIG. 1B) so that it makes electrical contact with the select fire assembly. While the common ground contact 39D is illustrated as a wire/ground wire, it is contemplated that the common ground contact 39D may be a substantially flat piece of material. To be sure, the common ground contact 39D may be formed into any shape that enables it to flexibly bend or wrap around the collar 36. By having a defined part of the select fire sub assembly of the perforating gun, i.e. the collar 36, for receiving the common ground contact 39D, the common ground contact 39D is able to provide continuous electrical connection with the select fire sub assembly. In addition, the common ground contact 39D may be easily removed and repositioned on the collar 36, without being torn, crimped and/or nicked during installment and/or use of the select fire sub assembly. While the common ground contact 39D may be manufactured from a variety of metals, in an embodiment the common ground contact 39D is formed from copper, stainless steel, aluminum and/or brass.

Figure 2:
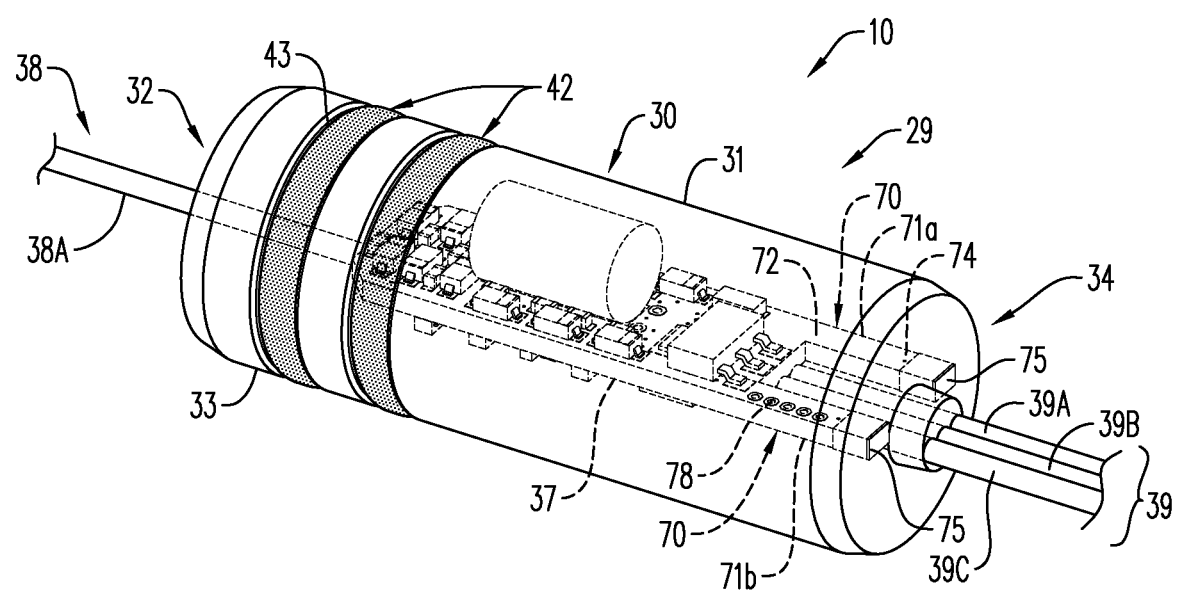
FIG. 2 is a perspective view of a pressure bulkhead structure for use with an integrated selective electronic switch circuitry, according to an embodiment.
Figure 3A:
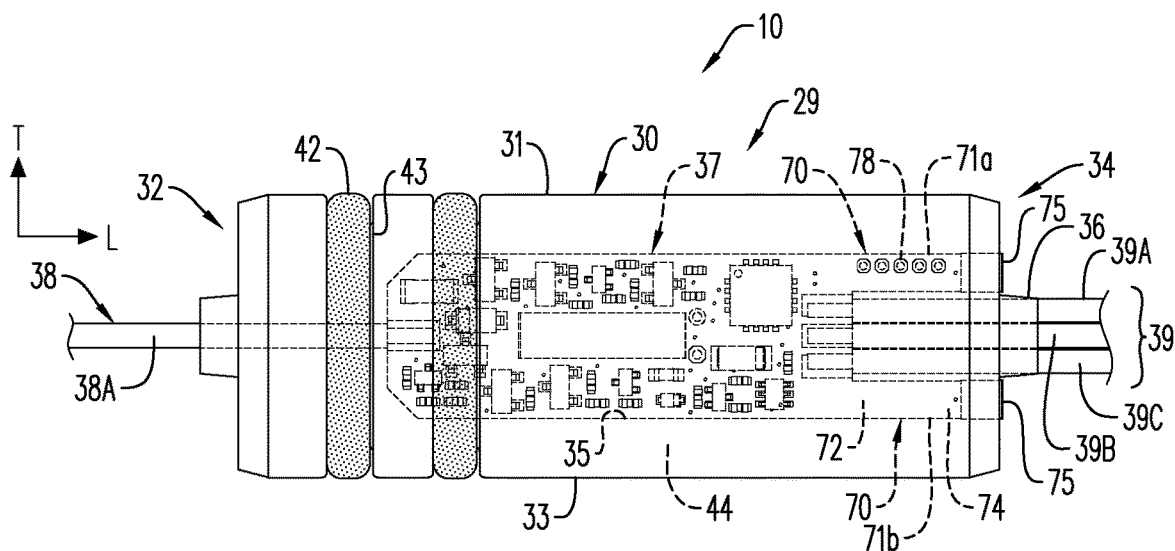
FIG. 3A is a bottom view of the pressure bulkhead structure of FIG. 2.
Figure 3B:
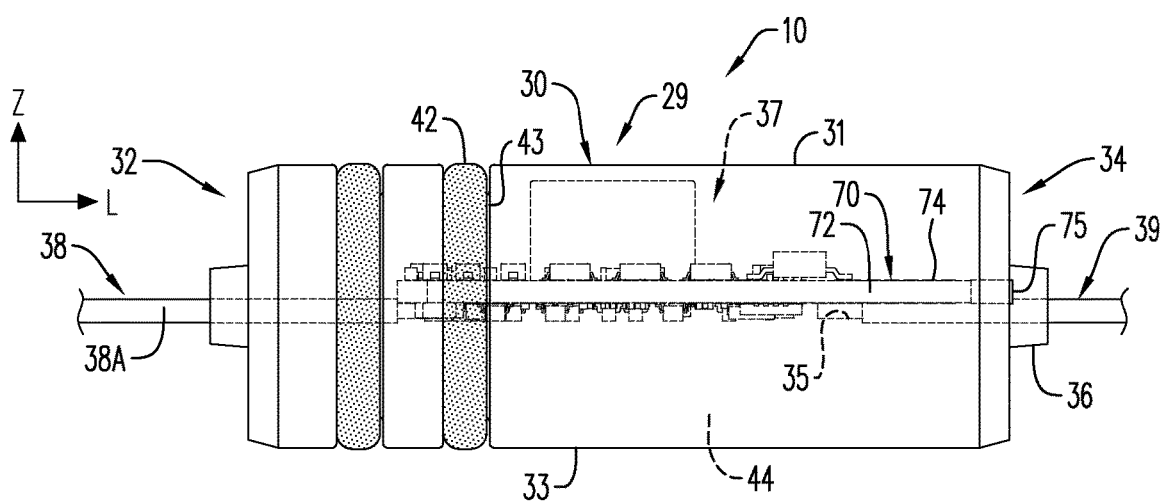
FIG. 3B is a side view of the pressure bulkhead structure of FIG. 2.

FIGS. 2 and 3A-3B illustrate a further embodiment of the pressure bulkhead structure 10. For purposes of convenience, and not limitation, the various features, attributes, and properties, and functionality of the pressure-isolating enclosure 29 (including the pressure-isolating enclosure body 30), the selective electronic switch circuitry 37, the electrical connector 38, and the wiring arrangement 39 discussed in connection with FIGS. 1A and 1B are not repeated here.

FIGS. 2 and 3A-3B illustrate the pressure bulkhead structure 10 including a plurality of ground arms (fingers or protrusions) 70. It is contemplated that the ground arms 70 are partially formed from the same material used to form the selective electronic switch circuitry 37. For instance, the ground arms 70 may be formed by stamping, cutting out, or wet chemically etching a centrally extending section of the selective electronic switch the circuit board 37, thereby leaving lateral portions that help to form a portion of the ground arms 70. The ground arms 70 each extend from the selective electronic switch circuitry 37 through the sealed second end 34. In an embodiment, the ground arms extend along the longitudinal direction L of the enclosure body 30.

Each ground arm 70 has a fixed end 72 and a free end 74. The fixed end 72 may extend directly from the selective electronic switch circuitry 37, while the free end 74 is at least able to engage with materials or surfaces external to the pressure bulkhead structure 10 (see, for instance, FIG. 9). As seen in FIGS. 3A-3B, the free end 74 at least partially extends through the sealed second end 34. In this configuration, the ground arms 70 may make electrical ground contact with, for example, a select fire sub assembly 600 of a perforating gun assembly (see, for instance, FIG. 9). A contact pad 75 is coupled to or otherwise extends from the free end 74. The contact pad 75 may be formed of a conductive material, such as copper or a gold-plated material, and may be configured as a generally flat plate or cap that is affixed to the free end 74. According to an aspect, the contact pads 75 are clipped on, chemically vapor deposed, or otherwise coupled to, the free ends 74 of each of the ground arms 70. When the pressure bulkhead structure 10 is arranged in, for example, the perforating gun select fire sub assembly 600, the contact pads 75 make electrical connections with corresponding electrically conductive materials within the sub assembly 600. This eliminates the need for additional ground wires and other components to make the electrical connection.

FIGS. 2 and 3A illustrate two ground arms, namely a first ground arm 71a and a second ground arm 71b. According to this embodiment, each ground arm 71a, 71b is integrally formed with the selective electronic switch circuitry 37, and is bilaterally spaced apart at a distance from each other, thereby creating a gap or space for receiving the wiring arrangement 30. Thus, the wiring arrangement 39 may be positioned between the first and second ground arms 71a, 71b in a sandwich-type configuration. In other words, the first and second ground arms 71a, 71b are at least spaced apart from each other at a distance that is substantially the same as a width of the wiring arrangement 39. The first ground arm 71a may be arranged so that it is parallel to the second ground arm 71b, which may be effective to help guide the wiring arrangement 39 in a desired orientation and/or maintain the wiring arrangement 39 in place.

One or more of the ground arms 70 may include a plurality of contact apertures 78. The contact apertures 78 extend from the upper surface to the lower surface of the selective electronic switch circuitry 37. As illustrated in FIGS. 2 and 3A, the apertures 78 may include an electrically conductive material coated on their inner surfaces. The electrically conductive material may include copper, gold, and the like. These coated apertures 78 help to ensure that the electrical connection and/or signals can pass through the upper surface and lower surfaces of the selective electronic switch circuitry 37.

Embodiments of the disclosure are further directed to a perforating gun assembly (not shown) that includes the aforementioned bulkhead structures 10 of FIGS. 1A-1B, and FIGS. 2 and 3A-3B. The bulkhead structures 10 may be for placement in a select fire sub assembly of a perforating gun module, and may form a pressure-isolating chamber between sequential perforating gun modules. The bulkhead structures 10, and well as any associated select fire sub assemblies including such bulkhead structures, may be isolated from the surrounding environmental conditions, including pressure changes, wellbore temperature and fluid/moisture, electrical charge variations, and physical shocks. In this embodiment, the bulkhead structure 10 is similar to the bulkhead structures 10 illustrated in FIGS. 1A and 1B, and FIGS. 2 and 3A-3B, and described hereinabove. Thus, for purposes of convenience, and not limitation, the various features, attributes, and properties, and functionality of the bulkhead structures 10 discussed in connection with FIGS. 1A and 1B, and FIGS. 2 and 3A-3B are not repeated here.

The pressure-isolating enclosure body 30 may further include an outer edge 33 and an inner edge 35. The inner edge 35 defines an interior space 44 within the pressure-isolating enclosure body 30. According to an aspect, the selective electronic switch circuitry 37 is positioned within the interior space 44, so that it is immovable and secured therein. The selective electronic switch circuitry 37 is connected to at least one initiator/detonator. The detonators may include a resistorized/electric detonator, an electronic detonator, a 50 Ohm safe detonator, and a detonator using a fire set, an EFI, an EBW, a semiconductor bridge and/or an igniter.

The bulkhead structure 10 of the perforating gun assembly may include the electrical connector 38, such as the wired electrical connector 38A illustrated in FIGS. 1A and 1B, and the wiring arrangement 39. In an embodiment, the bulkhead structure 10 includes a ground feature. The ground features may include one of the common ground contact 39D illustrated in FIGS. 1A and 1B and the ground arms 70 of FIGS. 2 and 3A-3B. The wiring arrangement 39 may provide electrical communication connection between the selective electronic switch circuitry 37 and other components outside the pressure-isolating enclosure body 30, while the common ground contact 39D or the ground arms 70 electrically contacts the sub assembly. According to an aspect, the common ground contact 39D and the ground arms 70, when either is used, makes electrical contact with at least one of a body of the sub assembly and an inner surface of the sub assembly. In an embodiment the ground arms 70 may make electrical ground contact with the select fire sub assembly, and in turn, the perforating gun body. To be sure, when common ground contacts 39D are used, they may make a similar electrical ground contact.

Figure 4:
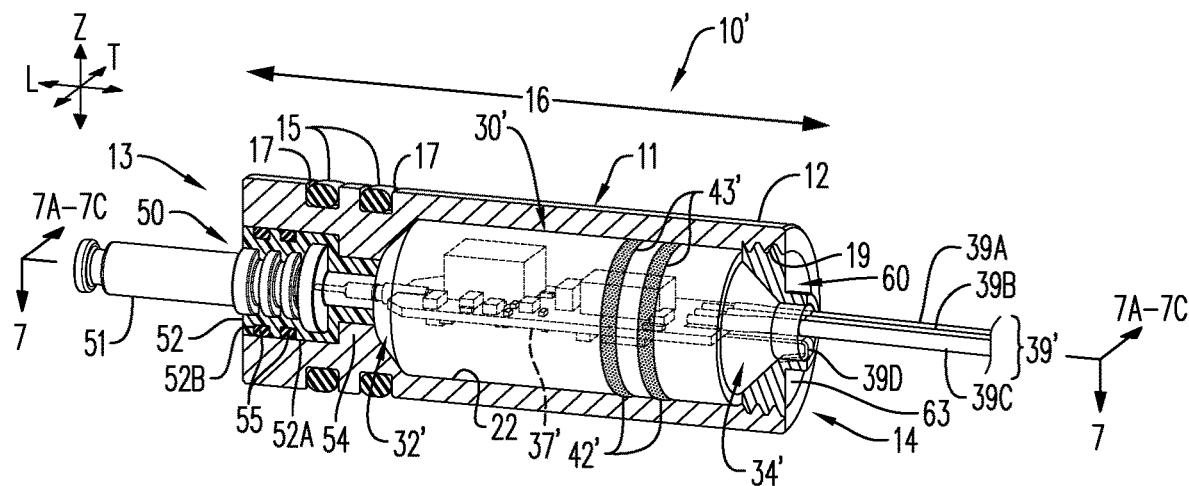
FIG. 4 is a partial, side cross-sectional view of a pressure bulkhead structure for use in a perforating gun select fire sub assembly, with integrated selective electronic switch circuitry contained within an inner pressure-isolating enclosure body, according to an embodiment.

Embodiments of the disclosure are further directed to a modular pressure bulkhead structure 10' (and enclosed modular internal component) for use in a perforating gun select fire sub assembly. In the illustrative example and as seen in the partial, side cross-sectional view of FIG. 4, the pressure bulkhead structure 10' has a longitudinal direction L, a transverse direction T, and a depth direction Z. The pressure bulkhead structure 10' as illustrated, is of a generally cylindrical overall shape, and includes an outer pressure-isolating enclosure (or outer housing) 11. The outer-pressure isolating enclosure 11 has an outer wall edge 12 and an inner wall edge 18 (as more clearly seen in FIG. 5). The inner wall edge 18 defines an interior cavity 22 within the outer-pressure isolating enclosure 11 (and the pressure bulkhead structure 10'). The outer pressure-isolating enclosure 11 itself, is shown having a generally elongated cylindrical body 16, including a first end 13 and a second end 14. As illustrated in FIG. 4, the generally elongated cylindrical body 16 is desirably of a single piece construction. Located along the periphery of the elongated body 16 is one or more pressure stabilizing devices/mechanisms (or pressure sealing features/structures) 15, such as the two illustrated O-rings 15, which are seated in externally-directed, circumferential grooves 17 contained along the outer wall edge 12 of the generally elongated body 16. The outer pressure-isolating enclosure 11 is desirably formed from a conductive non-corrosive material, such as the metal aluminum. Alternatively, it may be formed of a rigid thermoplastic material containing conductive material throughout, or of strategically positioned conductive material (so as to make contact with a common ground described below). Other potential construction materials of the outer pressure-isolating enclosure 11 include for example, brass, copper, stainless steel, aluminum, PEEK, and the like.

At the first end 13 of the generally elongated body 16, is seated a pin assembly 50. The pin assembly 50 is held tightly within an opening of the first end 13, such that no spatial gaps, which might compromise electronic circuitry contained within the interior cavity 22 of the pressure bulkhead structure 10', are formed at the first end 13. The illustrated pin assembly 50 is formed from traditional pin technology and includes a mechanical pin 51 (shown in perspective), and a pin seat 52 (shown in cross-section). The pin seat 52, as with the outer pressure-isolating enclosure 11, includes pressure sealing structures/mechanisms 53, such as one or more O-rings 53. Two O-rings 53 are illustrated seated in externally-directed circumferential grooves 52B formed in an externally-facing wall 52A of the pin seat 52. The pin 51 is conformably situated within the pin seat 52, and the resulting pin assembly 50 is conformably situated within the opening of the first end 13 of the generally elongated body 16 of the outer pressure-isolating enclosure 11. The pin assembly 50 lies adjacent a shelf-like structure (or internal collar) 54 defined along the inner wall edge 18 of the outer pressure-isolating enclosure 11. Specifically, the shelf-like structure 54 defines an annular opening in which the pin seat assembly 50 (including at least the pin seat 52, and in some instances the pin 51) may be situated. The pin 51 and pin seat 52 are formed respectively from traditional pin and pin-seat forming materials. For example, in an embodiment, the pin 51 is formed of a metal or metal alloy such as brass, while the pin seat 52 is formed from an injection molded polymeric material or machine plastic, such as those described hereinabove in detail. Desirably, in manufacturing, the pin assembly would be over molded with a heat resistant thermoplastic material such as for example PEEK, or PAG with glass fiber for additional protection, and include at least one pressure stabilizing device (such as an O-ring) about its outer surface as shown. The pin assembly 50 is insulated from the outer pressure-isolating enclosure 11 of the pressure bulkhead structure 10'. The pin 51 of the pin assembly 50 is connected to an adjacent perforating gun module (in a series of sequential perforating gun modules) to enable selective initiation of individual gun assemblies in the tool string. Such perforating gun modules are, for instance, described in U.S. Pat. No. 9,494,021 to Parks et al.

In an embodiment, as shown in FIG. 4, the inner wall edge 18 of the outer pressure-isolating enclosure 11 includes optional female threads 19 adjacent the second end 14, for receiving a threaded retainer 60 (having male threads 61 that conform with the female threads 19 along the inner wall edge 18). The optional threaded retainer 60 shown in cross-section in FIG. 4, is of an annular shape, in that it includes an optional pass-through/annular opening 62 (such as the opening defined by the elevated collar feature shown in FIG. 4) for passage of an electrical wiring arrangement 39 from selective electronic switch circuitry 37 contained within the pressure bulkhead structure 10' (or more precisely within a modular interior unit 29' (described below as an inner pressure-isolating enclosure) contained within the interior cavity 22 of the pressure bulkhead structure 10). In an alternative embodiment, the optional threaded retainer 60, may be solid (not shown), rather than defining an annular opening 62. In such an alternative embodiment, the wiring arrangement 39' from selective electronic switch circuitry 37' may pass through other channels within the pressure bulkhead structure 10'. The threaded retainer 60 may be formed from any of a variety of materials, such as for example molded thermoplastic polymer(s), or a machined metal. The threaded retainer 60 forms a tight seal at the second end 14 and in an embodiment, includes an upper edge 63 that is flush with the edge of the outer pressure-isolating enclosure 11 when the threaded retainer 60 is fully fastened in place (as shown). Rather than including a threaded retainer 60, the pressure bulkhead structure 10' may alternatively include a cap-like component. Still in a further embodiment, the pressure bulkhead structure 10' may be configured of multiple pieces itself (without a retainer), which together substantially surround the interior cavity 22. In yet a further embodiment, the pressure bulkhead structure 10' does not include either a retainer or multiple piece construction, but rather a wall of an internally housed body (described below) makes up part of the second end 14 of the outer pressure-isolating enclosure.

Figure 5:
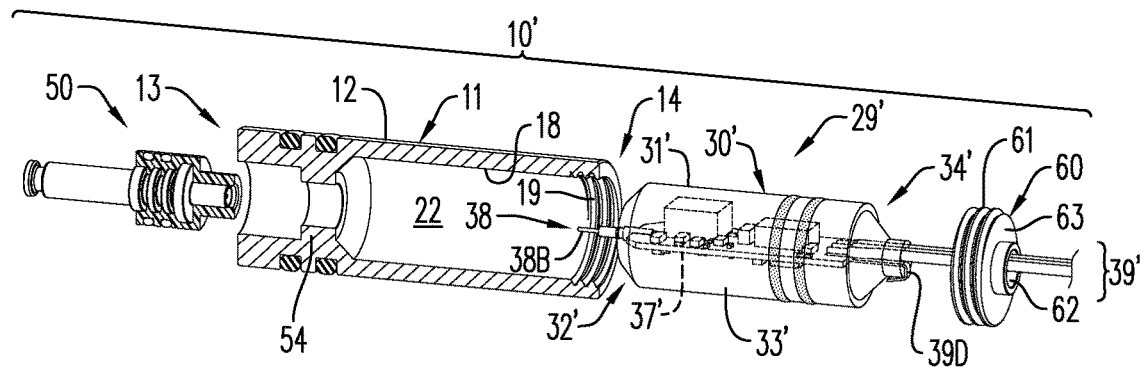
FIG. 5 is a partially exploded and side perspective view of a pressure bulkhead structure, according to an embodiment.
Figure 6:
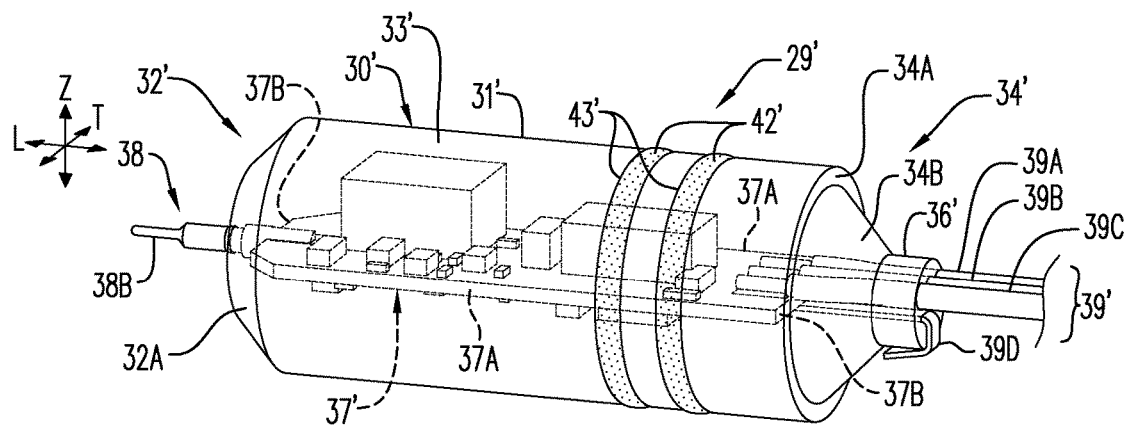
FIG. 6 is a perspective view of an inner pressure-isolating enclosure for use in a pressure bulkhead structure, according to an embodiment.

The pressure bulkhead structure 10' may include an inner pressure-isolating enclosure 29' (shown in perspective in FIGS. 5-6). The inner pressure-isolating enclosure 29' includes an inner pressure-isolating enclosure body 30', selective electronic switch circuitry 37' (circuit board), a pin contact 38B extending from the selective electronic switch circuitry 37', a wiring arrangement 39' (encompassing 39A-C) extending from the selective electronic switch circuitry 37', and a common ground contact 39D extending from the selective electronic switch circuitry 37'. At least a portion of each of the pin contact 38B, the wiring arrangement 39, and the common ground contact 39D is situated within the interior cavity 22 of the outer pressure-isolating enclosure 11 (of the overall pressure bulkhead structure 10'). The inner pressure-isolating enclosure body 30' may be of a generally cylindrical shape, having an elongated body portion 31'. In an embodiment, the inner pressure-isolating enclosure body 30' has a capsule-like shape with outer dimensions and tolerances that allows it to closely fit within the interior cavity 22 of the outer pressure-isolating enclosure 11. It is contemplated that the inner pressure-isolating enclosure body 30' may conform or press-fit to/with the shape of interior cavity 22 of the outer pressure-isolating enclosure 11. The inner pressure-isolating enclosure 30' may be formed of conformable materials that are similar to those used to form the pressure-isolating enclosure 30 illustrated in FIGS. 1A and 1B, and described hereinabove. Thus, for purposes of convenience, and not limitation, the various features, attributes, and properties, and functionality of such materials discussed in connection with FIGS. 1A and 1B are not repeated here. If the inner pressure-isolating enclosure body 30' is manufactured from conformable materials, such as elastomeric polymers, the relaxed outer dimensions of the inner pressure-isolating enclosure body 30' (containing the selective electronic switch circuitry 37', portions of pin contact 38A, wire arrangement 39', and common ground contact 39D), may actually be slightly larger (or within press-fit tolerances) than the dimensions of the interior cavity 22, prior to the actual insertion of the inner pressure-isolating enclosure body 30' into the interior cavity 22 of the outer pressure-isolating enclosure body 11. In this fashion, the inner pressure-isolating enclosure body 30' may serve as a module-like component that can be easily positioned within a variety of shaped/dimensioned pressure bulkhead structures. Depending on desired construction technique, the inner pressure-isolating enclosure body 30' encases the selective electronic switch circuitry (circuit board) 37', rather than merely be bonded to its outer perimeter side edges. In an alternative embodiment, the inner pressure-isolating enclosure body 30' encases the selective electronic circuit board 37', so that it is in contact with all outer surfaces of the selective electronic circuit board 37'.

The inner pressure-isolating enclosure body 30' has a sealed first end 32' which, when placed in the pressure bulkhead structure 10', is situated adjacent the pin assembly 50, and in particular, immediately adjacent a pin assembly receiving collar (a shelf-like structure) 54 located adjacent the first end 13, the collar 54 projecting from the inner edge 18 of the outer pressure-isolating enclosure 11. The pin contact 38B, which is in electrical connection to the selective electronic switch circuitry 37', extends through the sealed first end 32' and the opening of the receiving collar 54 to the pin 51. The inner pressure-isolating enclosure body 30' also includes a sealed second end 34' for positioning in the pressure bulkhead structure 10', adjacent an optional threaded retainer 60 if present, or at least adjacent the outer pressure-isolating enclosure 11 (elongated body 16), second end 14. Both a wiring arrangement 39', and a common ground contact 39D extend from the selective electronic switch circuitry 37' and out of the body 30' through the sealed second end 34'. The sealed first and second ends 32, 34 of the body 30 together prevent external pressure and/or environmental conditions of the wellbore from impacting the selective electronic switch circuitry 37'. The inner pressure-isolating enclosure body 30' includes an outer edge 33', which lies adjacent the inner edge 18 of the outer pressure-isolating enclosure 11, and an inner edge 35' (seen in FIG. 7). In an embodiment, it is desirable for the outer edge 33' to include few, if any, spatial gaps between it and the inner edge 18 of the outer pressure-isolating enclosure 11, so that it will be unlikely for the inner pressure-isolating enclosure body 30' (or its contents) to shift during sudden movement of the pressure bulkhead structure 10'. The reduction of special gaps may be the result of a press-fit type arrangement of the inner pressure-isolating enclosure body 30' and the outer pressure-isolating enclosure 11. One or more pressure stabilizing structures/features 42' (such as the two O-rings illustrated) may be seated in circumferential, outer grooves 43' of the outer edge 33' of the inner pressure-isolating enclosure body 30'. The inner edge 35' of the inner pressure-isolating enclosure body 30 surrounds a selective electronic switch circuitry 37'. Depending on the embodiment, the inner edge 35 may be in direct contact with the selective electronic switch circuitry 37' on all sides, or may define a void space in which the selective electronic switch circuitry 37' is located. The inner edge 35' may be held in immovable contact with the selective electronic switch circuitry 37' along one to six side edges (such as for the rectangular circuit board illustrated). For example, depending on the manufacturing method of the inner pressure-isolating enclosure body 30', there may be no gaps between the inner edge 35', the selective electronic switch circuitry 37', a portion of the pin contact 38B, portions of the extending wiring arrangement 39', and portions of the common ground contact 39D. As described hereinabove with respect to FIGS. 1A-1B, and as illustrated in FIGS. 2 and 3, the selective electronic circuitry 37, 37' includes a circuit board (in phantom) on which circuit components are positioned.

As more clearly seen in FIGS. 4 and 5 which illustrate a perspective view of the inner pressure-isolating enclosure 29', and partial top, cross-sectional view of the pressure bulkhead structure 10' respectively, in an embodiment, the sealed first end 32' of the inner pressure-isolating enclosure body 30' includes a tapered portion 32A that is tapered towards the outer pressure-isolating enclosure first end 13 (and pin assembly 50), although it need not be. The pin contact 38B extends through the sealed first end 32', to make contact with the pin of the pin assembly 50. The pin contact 38B extends from the selective electronic switch circuitry 37' (described further below) housed within the inner pressure-isolating enclosure body 30'. In an embodiment, the sealed second end 34' of the inner pressure-isolating enclosure body 30' also includes a taper, so that it is tapered outward towards the outer pressure-isolating enclosure second end 14, although it need not be. As illustrated in FIGS. 2-4, the sealed second end 34' includes an outermost flattened portion 34A or ridge, a tapered portion 34B, and a collar structure 36' that forms an encircling seal about the wiring arrangement 39' (and common ground contact 39D). The threaded retainer 60 surrounds the collar structure 36'.

As illustrated in FIGS. 2-5, each sealed end 32', 34' of the inner pressure-isolating enclosure body 30' allows components to pass either to the pin assembly, or alternatively to detonators/other externally located components (such as the outer pressure-isolating enclosure 11). The wiring arrangement 39' and the common ground contact 39D pass through the sealed second end 34'. The wiring arrangement 39' extends from the selective electronic switch circuitry 37' to an additional perforating gun select fire sub assembly component, such as a detonator or other components. The common ground contact 39D is directed over the collar 36' to a location either under the threaded retainer 60 so that it can be in electrical connection with the retainer (if it is formed of a conductive material) which itself is in electrical connection with the outer pressure-isolating enclosure 11/pressure bulkhead structure 10', or alternatively, over the collar 36' and the threaded retainer 60 such that it is in direct electrical connection/communication with the outer pressure-isolating enclosure 11/pressure bulkhead structure 10' (which is also in contact with the select fire assembly 80 described below). In an embodiment, the common ground contact 39D extends from the selective electronic switch circuitry 37' over the collar 36' and the retainer 60, such that it may make direct electrical contact with conductive material in the select fire assembly 80.

Figure 7:
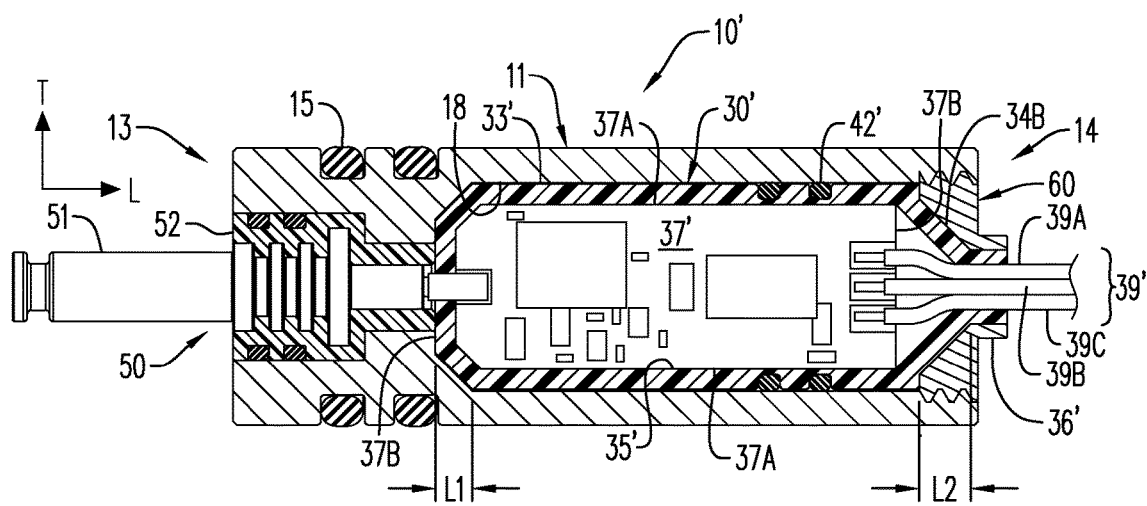
FIG. 7 is a top, partial cross-sectional view of a pressure bulkhead structure with integrated selective electronic switch circuitry, according to an embodiment.

In an embodiment, the inner pressure-isolating enclosure body 30' is seated immediately against the inner edge 18 of the outer pressure-isolating enclosure 11 at least along substantial portions of the longitudinal directions of both the inner and outer pressure-isolating enclosures. For example, the outer edge 33' of the inner pressure-isolating enclosure body 30' may extend between about an amount greater than 0 and 10 percent, alternatively between about 1 and 15 percent of the longitudinal direction L of the outer pressure-isolating enclosure 11. In an embodiment, the length L1 of the outwardly tapered portion 32A on the sealed first end 32' of the inner pressure-isolating enclosure body 30', is between about 1 and 15 percent of the entire length (between most distant points of the sealed first 32' and second end 34') of the inner pressure-isolating enclosure body 30'. In an embodiment, the length L2 of the outwardly tapered portion 34B on the sealed second end 34' of the inner pressure-isolating enclosure body 30', is between about 0.5 and 20 percent of the entire length (between the most distant points of the sealed first 32' and second end 34') of the inner pressure-isolating enclosure body 30'. As seen in FIG. 7, the length L2 of the outwardly tapered portion 34B is larger than the length L1 of the outwardly tapered portion 32A. In an embodiment, the sealed second end 34' is sized to accommodate the passage of both the wiring arrangement 39' and the common ground contact 39D.

The inner pressure-isolating enclosure body 30' is in an embodiment, of a unitary construction, in that it is formed of a single material. In an embodiment, the inner pressure-isolating enclosure body 30' is formed without manufacturing seams. The inner pressure-isolating enclosure body 30' may be formed from a nonconductive material, such as, for example a thermoplastic polymeric material. The inner pressure-isolating enclosure body 30' may be formed from polyolefin materials. In an embodiment, the inner pressure-isolating enclosure body 30' is formed from PAG with glass fibers, PEEK, or silicone. Alternatively, such inner pressure-isolating enclosure body 30' is formed from fluorocarbon (FKM). Alternatively, such body 30' may be formed from, PC, PE, and the like. If such inner pressure-isolating enclosure body 30' is formed from a gel-like or elastomeric material, it may be formed from synthetic resin, and in an embodiment, materials that can withstand degradation at temperatures of between about 100° C. and 260° C., and external pressures of between about 10,000 psi and 25,000 psi. The O-rings 42' that may be present in circumferential grooves 43' on the outer edge 33' of the inner pressure-isolating enclosure body 30' (as well as the other previously described O-ring features), may be formed from various sealing materials, such as for example, polymeric materials, natural rubbers, silicones and such, and desirably of material capable of withstanding degrading at temperatures of between about 100° C. and 260° C.

The inner pressure-isolating enclosure body 30 may be manufactured by a variety of techniques depending on desired material(s) of construction and desired performance attributes of the body. As noted, the materials of construction may include for example, thermoplastics and silicone rubber gels. Such manufacturing techniques include for example, injection over-molding, blow molding, extrusion molding, rotational molding, three-dimensional printing, over-coating, and traditional multi-piece, adhesive type construction techniques. In an embodiment, such inner pressure-isolating enclosure body 30' is manufactured using an injection over-molding process that conforms the inner edge 35' of the inner pressure-isolating enclosure body 30' closely to the outer dimensions of the selective electronic switch circuitry 37', a portion of the pin contact 38B peripheral edge, a portion of the wire arrangement 39' peripheral edges, and a portion of the common ground contact 39D peripheral edge, such that no spatial gaps exist between the circuitry, pin contact, wire arrangement, common ground contact and the inner edge(s) 35' of the inner pressure-isolating enclosure body 30'. In an embodiment, the inner pressure-isolating enclosure body 30' is manufactured without seams, such as for example, by an injection over-molding process (described in further detail hereinbelow). The inner pressure-isolating enclosure body 30' may be produced using at least one of an injection over-molding manufacturing process, a potting process, or a three-dimensional printing process (hereinafter 3D printing), such that it is directly formed about the selective electronic switch circuitry 37' contained and sealed therein. It is contemplated that the inner pressure-isolating enclosure body 30' may be formed using the two-step injection molding process described hereinabove, so that the inner pressure-isolating enclosure body 30' includes a first layer (i.e., inner protective layer) of injection molding material adjacent the selective electronic switch circuit board 37, and a second layer of injection molding material adjacent the first layer.

In an embodiment, the circuit board of the selective electronic switch circuitry 37' is positioned within the inner pressure-isolating enclosure body 30' such that at least one of its end edges is spaced apart from the sealed first and second ends 32', 34' of the inner pressure-isolating enclosure body 30'. For instance, as clearly seen in FIGS. 2 and 5, the circuit board of the selective electronic switch circuitry 37' is spaced apart along the longitudinal direction, from the sealed second end 34', and terminates at a position within the body 30' removed from the tapered second end 34B, such that the threaded retainer 60 does not sit over any portion of the selective electronic switch circuitry and circuit board 37' itself.

In this embodiment, the selective electronic switch circuitry 37' is similar to the selective electronic switch circuitry 37 illustrated in FIGS. 1A and 1B, and described hereinabove. Thus, for purposes of convenience, and not limitation, the various features, attributes and properties, functionality, and construction of the selective electronic switch circuitry 37' discussed in connection with FIGS. 1A and 1B are not repeated here.

The selective electronic switch circuitry 37' (and accompanying circuit board) for communicating, arming and initiating firing of the perforating gun, is housed within the inner pressure-isolating enclosure body 30'. The selective electronic switch circuitry 37' is immune to RF frequencies and/or unwanted direct and indirect stray voltage and current. In an embodiment, the selective electronic switch circuitry 37' is encased within the inner pressure-isolating enclosure body 30' such that it is immovable within the inner pressure-isolating enclosure body 30' as well as the outer pressure-isolating enclosure 11. In an alternative embodiment, such selective electronic switch circuitry 37' of the inner pressure-isolating enclosure body 30 is coated with a conformal coating as is known in the electronic arts. In any event, the selective electronic switch circuitry 37' is desirably placed within the inner pressure-isolating enclosure body 30' such that it is protected from both shocks/vibrations, and other environmental conditions.

In an embodiment, the selective electronic switch circuitry 37 has extending from it at least a wiring arrangement 39' and one common ground contact 39D. According to an aspect, the wiring arrangement 39' is a three wire arrangement as illustrated. The wiring arrangement 39' (or electrical connection lines) includes an outwardly directed detonator power line 39A (line-out), an outwardly directed detonator ground line 39B (ground), and a communications line 39C (line-in or hot-wire to detonator). The common ground contact 39D may also ground the selective electronic switch circuitry 37' to the outer pressure-isolating enclosure 11 and, in some embodiments, to the select fire assembly 80, either directly or indirectly. The common ground contact 39D wraps either about the collar/edge 36' of the sealed second end 34' of the inner pressure-isolating enclosure body 30' (and in some instances the threaded retainer 60 if present) such that it can make electrical contact with either a metal threaded retainer 60 or the outer pressure-isolating enclosure 11 itself (which is desirably of metal construction in an embodiment). The outer pressure-isolating enclosure 11 is in direct contact with the select fire assembly 80 (as will be further described below).

As noted, FIG. 4 illustrates a partial cross-sectional view of a pressure bulkhead structure 10' in accordance with the disclosure. In particular, side cross-sectional views of the pin seat 52, outer pressure-isolating enclosure 11, and threaded retainer 60 are shown. In contrast, a perspective view of the inner pressure-isolating enclosure body 30' and the pin 51 can be seen in the same figure, while the selective electronic switch circuitry 37' can be seen in phantom. FIG. 5 illustrates a partially exploded (and cross-sectional view) of an embodiment of the pressure bulkhead structure 10'. However, in contrast to the embodiment of FIG. 4, which illustrates the common ground contact 39D wrapped about an edge of the threaded retainer 60, the common ground contact 39D in FIG. 5 is shown wrapped about the edge of the collar 36' of the inner pressure-isolating enclosure body 30' to make direct contact only to an unexposed surface of the retainer (which will be in direct contact with the outer pressure-isolating enclosure 11 conductive surface).

Figure 7A:
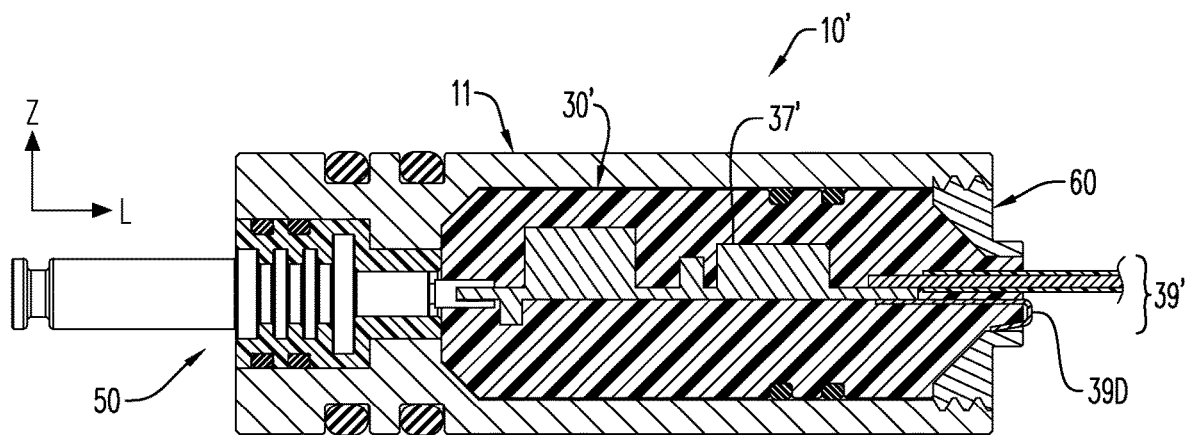
FIG. 7A is a side, partial cross-sectional view of a pressure bulkhead structure with integrated selective electronic switch circuitry, according with an embodiment.

As seen in FIG. 6, a perspective view of an inner pressure-isolating enclosure 29' is illustrated. The view also illustrates a wiring arrangement 39' extending out from the selective electronic switch circuitry 37' and the enclosure body 30', as well as a common ground contact 39D extending from the circuitry 37' that has been wrapped about the collar 36' located at the sealed second end 34' of the enclosure body 30'. The selective electronic switch circuitry 37' can be seen in phantom within the enclosure body 30'. As seen in FIG. 7, a top, cross sectional view of the pressure bulkhead structure 10' is illustrated showing a top view of the selective electronic switch circuitry 37', which transversely directed outer edge 37B is spaced inwardly from the tapered portion 34B of the sealed second end 34' of the inner pressure-isolating enclosure body 30'. The threaded retainer 60 (which includes male threads to match the female threads 19 located along the inner edge 18 of the outer pressure-isolating enclosure 11) is situated spaced apart from the transversely directed outer edge 37B of the selective electronic switch circuitry 37' (when viewed along the longitudinal direction L). The entire dimensions of the selective electronic switch circuitry 37' are defined by generally longitudinally directed outer edges 37A and the transversely directed outer edges 37B. In an embodiment, at least the longitudinally directed outer edges 37A are positioned immediately adjacent or in direct physical contact with the inner edge 33' of the inner pressure-isolating enclosure body 30'. In an alternative, all of the outer edges (along the longitudinal and transverse directions) of the selective electronic switch circuitry 37' are immediately adjacent or in direct physical contact with the inner edge 33' of the inner pressure-isolating enclosure body 30'. In still a further alternative embodiment (as seen in FIG. 7A), all surfaces including all outer side edges and top and bottom surfaces of the selective electronic switch circuitry 37' are immediately adjacent or in direct physical contact with the inner edge 33' of the inner pressure-isolating enclosure 30'. Such direct contact can be achieved by several of the previously described manufacturing methods which injection overmold, print or extrude the inner pressure-isolating enclosure body 30' about the selective electronic switch circuitry 37'. In yet a further alternative embodiment, the inner edge 33' defines an internal void space in the inner pressure-isolating enclosure body 30', in which the selective electronic switch circuitry 37' is located. Such circuitry can be either adhesively bonded, press-fit, or otherwise sized to be immovably placed within the inner pressure-isolating enclosure body 30'.

Desirably, in an embodiment, the inner pressure-isolating enclosure body 30' has outermost dimensions that allow it to conform tightly to the dimensions of the interior cavity 22 of the outer pressure-isolating enclosure 11, such as those embodiments illustrated in the figures. In such embodiments, the relative thickness of the walls of the inner pressure-isolating enclosure body 30' may vary along the longitudinal direction, the transverse direction, the depth direction, or combination of multiple directions, depending on the height of the circuitry components along housed circuit boards. Essentially, in an embodiment, the selective electronic switch circuitry 37' will be immovable within the inner pressure-isolating enclosure body 30' as the walls of the enclosure body 30' are conformably fit directly over the circuitry 37', and also dimensioned to conformably fit within the interior cavity 22. A side cross-sectional view of a pressure bulkhead structure 10' is shown in FIG. 7A. As can be seen in the figure, the inner pressure-isolating enclosure body 30' is formed to entirely encase the selective electronic switch circuitry 37', with varying wall thicknesses along the length L, depending on circuitry features.

Figure 7B:
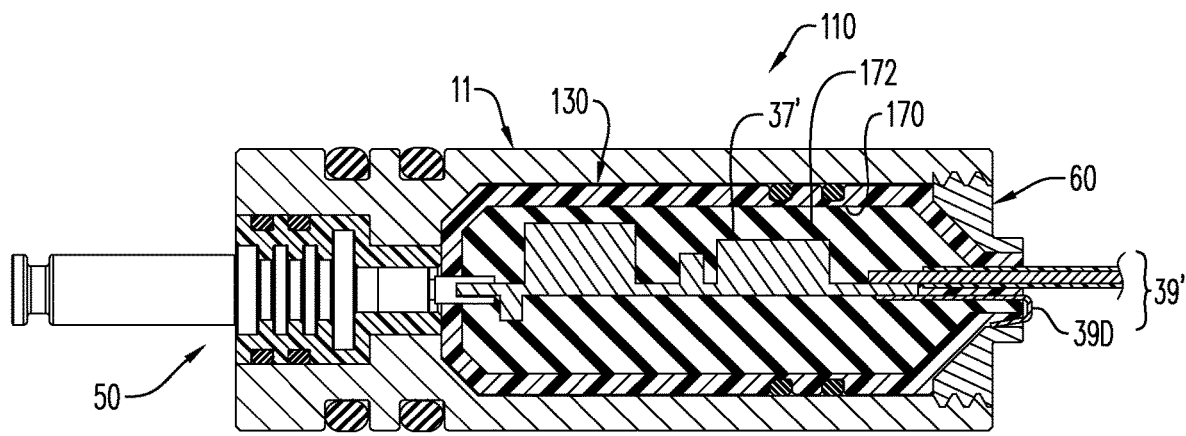
FIG. 7B is a side, partial cross-sectional view of an alternative pressure bulkhead structure with integrated selective electronic switch circuitry, according to an embodiment.

An alternative embodiment of a pressure bulkhead structure 110 can be seen in FIG. 7B. Such figure shows a side cross-sectional view of the pressure bulkhead structure 110. As can be seen in the figure, the inner pressure-isolating enclosure body 130 of the alternative embodiment can include two distinct over-molded layers, an outer layer 170 and an inner layer 172. The inner layer 172 can directly encase the selective electronic circuitry 37'. The two layers can be formed from different polymeric materials, such as for example, from two different thermoplastic materials.

Figure 7C:
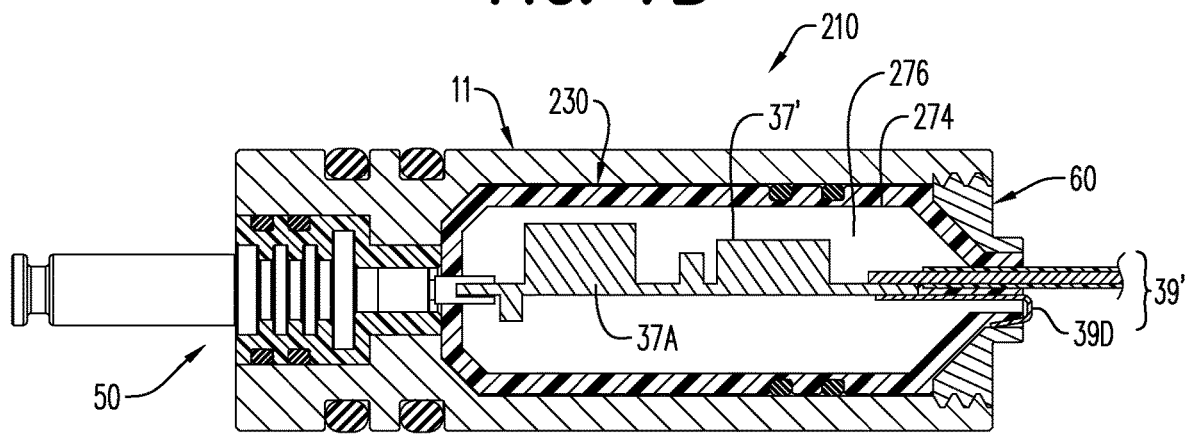
FIG. 7C is a side, partial cross-sectional view of an alternative pressure bulkhead structure with integrated selective electronic switch circuitry, according to an embodiment.

A further alternative embodiment of a pressure bulkhead structure 210 can be seen in FIG. 7C. Such figure shows a side, cross-sectional view of the pressure bulkhead structure 210. The pressure bulkhead 210 includes an inner pressure-isolating enclosure body 230. The inner pressure-isolating enclosure body 230 includes a layer 274, which is attached to the selective electronic circuitry 37' along the side longitudinal side edges 37A. A space 276 exists between the upper and lower surfaces of the circuitry 37' and the layer 274.

Figure 8A:
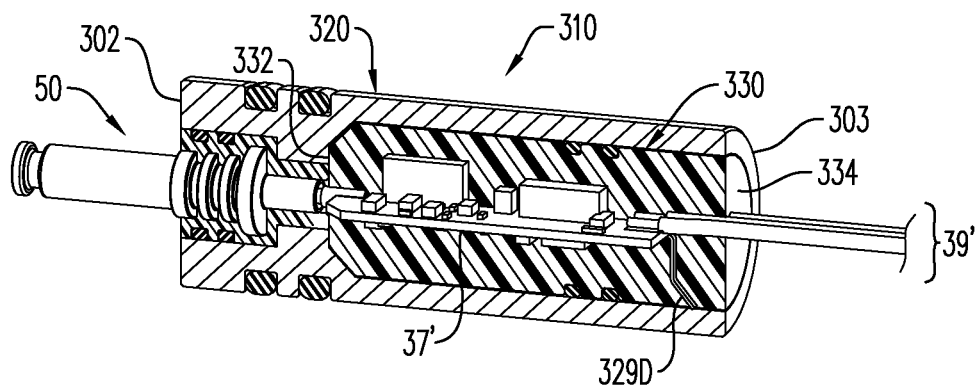
FIG. 8A is a side, partial cross-sectional view of an alternative pressure bulkhead structure with integrated selective electronic switch circuitry, according to an embodiment.

An alternative embodiment of a pressure bulkhead structure 310 is illustrated in FIG. 8A. In the figure, a partial cross-sectional view of the pressure bulkhead structure 310 with integrated selective electronic switch circuitry 37' is shown. The pressure bulkhead structure 310 includes an outer pressure-isolating enclosure 320 having a first end 302 and a second end 303. A pin assembly 50 including a pin 51 and pin seat 52 (as previously described) is situated in an opening within the first end 302 of the outer pressure-isolating enclosure 320. Also as in prior embodiments, the pin assembly 50 is operatively connected to a selective electronic switch circuitry 37' that is housed within an inner pressure-isolating enclosure body 330. The inner pressure-isolating enclosure body 330 has a sealed first end 332 adjacent the pin assembly 50 (and the outer pressure-isolating enclosure 320, first end 302) and a sealed second end 334 adjacent the outer pressure-isolating enclosure 320, second end 303. Rather than including a threaded retainer as in the previously described embodiments, the inner pressure-isolating enclosure body 330 is sized to extend the entire dimension of the interior cavity 22 of the outer pressure-isolating enclosure 320. Therefore the sealed second end 334 extends to a length that is flush with the second end 303 of the outer pressure-isolating enclosure 320. The inner pressure isolating enclosure body 330 is therefore sized to immovably and completely fill the interior cavity 22. A wiring arrangement 39' extends from the selective electronic switch circuitry 37' that is contained in the inner pressure-isolating enclosure body 330, outwardly from the sealed second end 334. A common ground contact 329D extends through a side wall of the inner pressure-isolating enclosure body 330 to make electrical contact with an inner edge of the outer pressure-isolating enclosure 320 (which is constructed with a conductive material, such as a metal). In an embodiment, the outer pressure-isolating enclosure 320 is formed from a metal selected from the group including aluminum, titanium, brass, and steel. As with other previously described embodiments, the pin 51 and circuitry 37' are shown in perspective view.

Figure 8B:
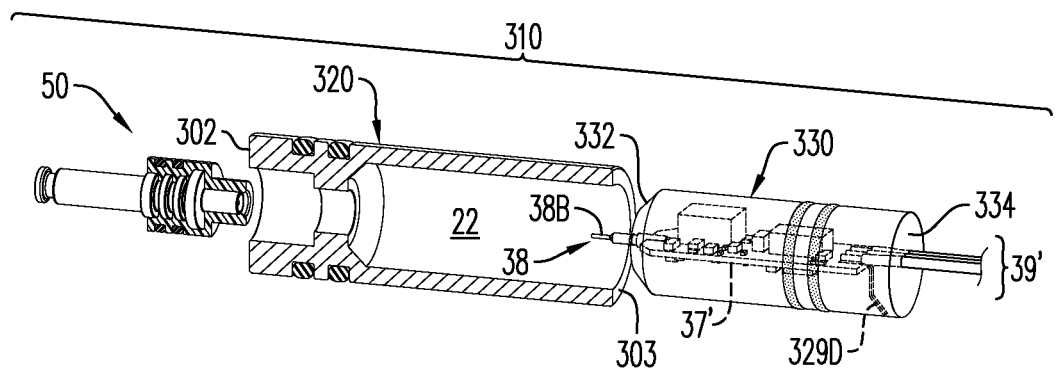
FIG. 8B is a partial exploded, side cross-sectional view of the pressure bulkhead structure with integrated selective electronic switch circuitry of FIG. 8A.

A partial exploded, side cross-sectional view of the embodiment of FIG. 8A is shown in FIG. 8B. As more clearly shown in this figure, the sealed second end 334 of the inner pressure-isolating enclosure body 330 is relatively planar or flat in configuration, but need not be so. In contrast, the sealed first end 332 includes a tapered portion as previously described. The design of this embodiment does not necessitate any additional retainer or cap-like device.

Figure 8C:
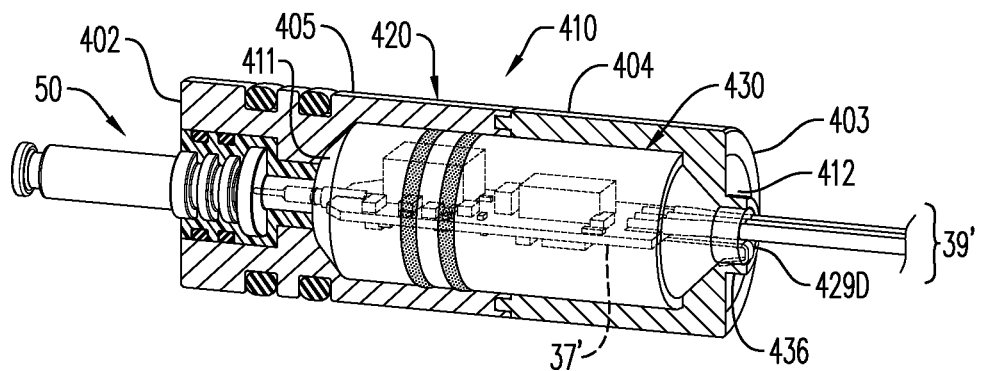
FIG. 8C is a partial, side cross-sectional view of a splittable pressure bulkhead structure with integrated selective electronic switch circuitry according to an embodiment.
Figure 8D:
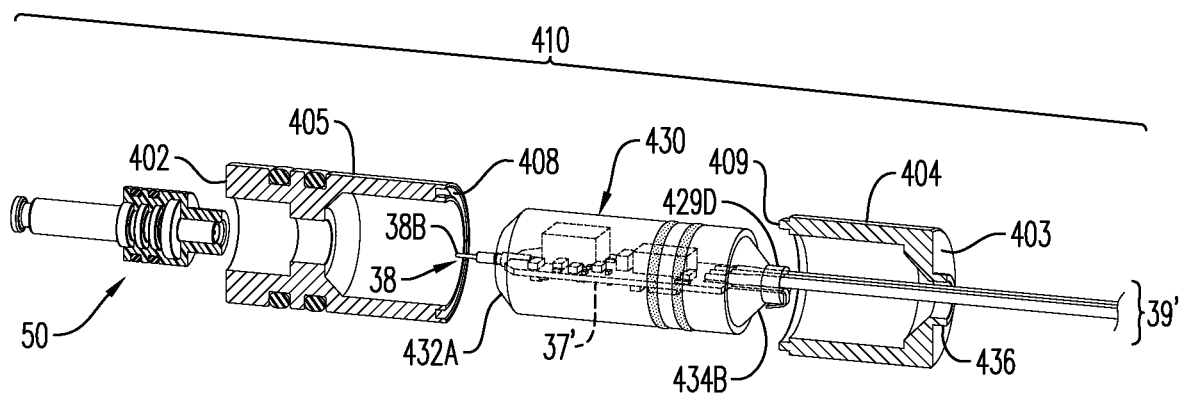
FIG. 8D is a partial exploded, side cross-sectional view of a splittable pressure bulkhead structure with integrated selective electronic switch circuitry according to an embodiment.

FIGS. 8C and 8D illustrate a partial, cross-sectional view of a splittable pressure bulkhead structure 410 with integrated selective electronic switch circuitry 37, according to another embodiment. The splittable pressure bulkhead structure 410 includes an outer pressure-isolating enclosure 420, generally having a first end 402 and a second end 403. The outer pressure-isolating enclosure 420 is itself formed from two mated sections 405, 404 which may be held to one another along mated edges 408, 409 (as seen in FIG. 8D). The mated edges 408, 409 may be fastenable to one another via a threading arrangement (i.e. screwed together), by a snap-type or interlocking lock, or alternatively, by an adhesive application, or friction. The two mated sections may be asymmetrical in length as shown, or alternatively, symmetrical in length. A pin assembly 50 including a pin and pin seat, is positioned in an opening at the first end 402 (as with previously described embodiments, but in this embodiment specifically from the first end 402 which is part of the mated section 405). As with previous embodiments, it is held sealed in place, and in electrical connection with a pin contact 38B that extends from the circuitry 37', and through a sealed end of the inner pressure-isolating enclosure body 430. However, rather than also including a threaded retainer to hold the inner pressure-isolating enclosure body 430 in place, the inner pressure-isolating enclosure body 430 (which houses the selective electronic switch circuitry 37'), is enclosed between the two mated sections 405, 404 of the outer pressure-isolating enclosure 420. The inner pressure-isolating enclosure body 430 includes in this embodiment a sealed first tapered end 432A and a sealed second tapered end 434B, which are configured to fit in a conforming relationship within the interior cavity surface formed from the mated outer pressure-isolating enclosure sections 405, 404. As with previously described embodiments, a wiring arrangement 39' and common ground contact 429D extend from the selective electronic switch circuitry 37' through a sealed second end 434B of the inner pressure-isolating enclosure body 430. However, since the embodiment does not include a threaded retainer, the wiring arrangement 39' extends through a sealed collar 436 at the second end 403 of the outer pressure-isolating enclosure 420 (and specifically through section 404). In the embodiment illustrated in FIG. 8D, the common ground contact 429D also extends out from the selective electronic circuitry 37' through the sealed end 434B of the inner pressure-isolating enclosure body 430 and wraps about the collar 436 on section 404 of the outer pressure-isolating enclosure 420, in order to make electrical contact with the conductive outer pressure-isolating enclosure 420 (which like previous embodiments is either entirely formed of a conductive material, or alternatively, partially formed of a conductive material). In another embodiment, only mated section 404 is formed of a conductive material. FIG. 8D illustrates an exploded, partial cross-sectional side view of a splittable pressure bulkhead structure 420 with selective electronic switch circuitry 37'. The mated edges 408, 409 can be more clearly seen in this figure. The pin 51 and inner pressure-isolating enclosure body 430 are illustrated in perspective view, while the circuitry 37 is shown in phantom. As seen in FIG. 8D, the common ground contact 429D is positioned underneath, but is still in contact with section 404.

Figure 8E:
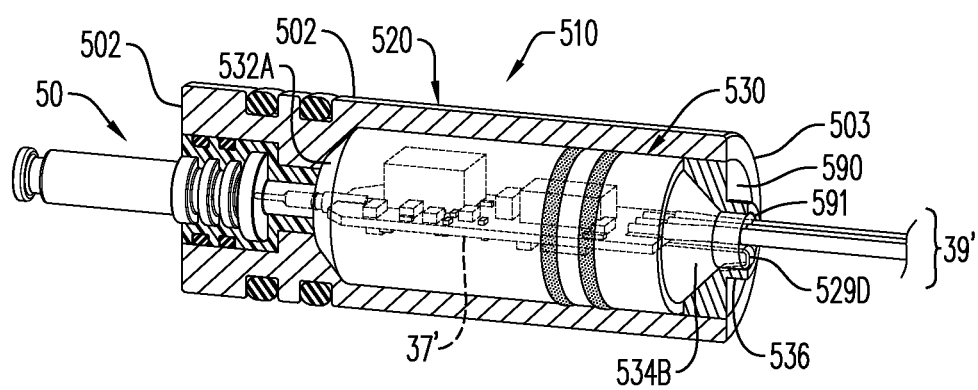
FIG. 8E is a partial, side cross-sectional view of a capped pressure bulkhead structure with integrated selective electronic switch circuitry according to an embodiment.
Figure 8F:
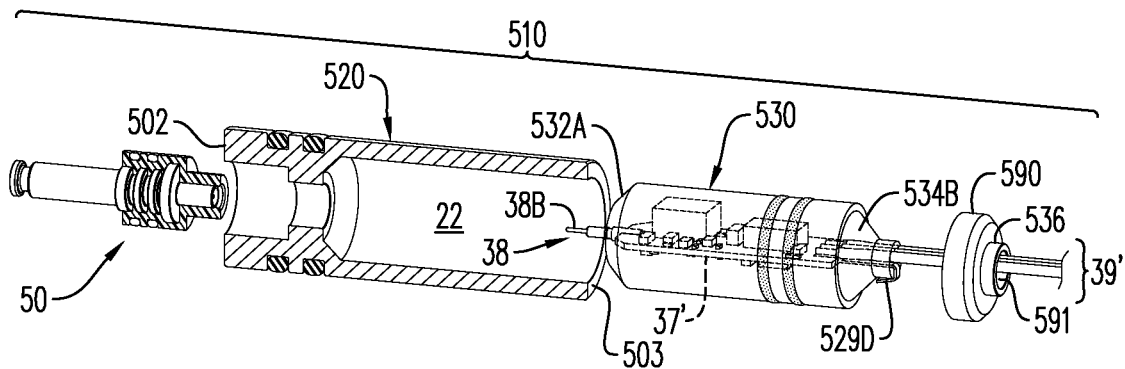
FIG. 8F is a partially exploded, side cross-sectional view of a capped pressure bulkhead structure with integrated selective electronic switch circuitry according to an embodiment.

FIG. 8E is a partial, cross-sectional view of a capped pressure bulkhead structure 510 containing a pin assembly 50 and integrated selective electronic switch circuitry 37' (itself housed within an inner pressure-isolating enclosure body 530) according to a further embodiment. The pressure bulkhead structure 510 includes an outer pressure-isolating enclosure 520 having a first end 502 and a second end 503. A pin assembly 50 (as with previously described embodiments) is sealed in an opening in the outer pressure-isolating enclosure 520 at the first end 502. The inner pressure-isolating enclosure body 505 includes a sealed first end 532A (that is illustrated as tapered) adjacent the pin assembly 50 and the outer pressure-isolating enclosure first end 502. As with prior embodiments, the pin of the pin assembly is adjacent to/in electrical connection with a pin contact extending from the inner pressure-isolating enclosure body 530, and specifically through the sealed first end 532A from the selective electronic switch circuitry 37' contained in the inner pressure-isolating enclosure body 530. The inner pressure-isolating enclosure body 530 also includes a sealed second end 534B (that is also tapered in the illustrated embodiment) that is adjacent the outer pressure-isolating enclosure second end 503. Rather than including a threaded retainer as in a previously described embodiment, a removable end cap 590 is included in this embodiment, which end cap 590 is held in a conforming relationship with the inner pressure-isolating enclosure body sealed second end 534B. The end cap 590 is seated on the sealed second end 534B of the inner pressure-isolating enclosure body 530 (and surrounded by the outer pressure-isolating enclosure second end 520 edge), such that a wiring arrangement 39' may extend through a collar-like opening of the sealed second end 534B through a collar-like opening 591 in the end cap 590. The end cap 590 may be held in place by adhesive, frictional forces, or other bonding methods, or may alternatively be snapped into position, such that it is locked in place around the conforming shape of the sealed second end 534B. In a further alternative embodiment, the end cap 590 may be held in place by a non-illustrated structure which exerts pressure on it towards the sealed second end 534B, from a position external to the pressure bulkhead structure 510. The end cap 590 may be formed from a conductive material, such as the metal aluminum. As illustrated in FIG. 8E, a common ground contact 529D extends from the selective electronic switch circuitry 37 through the collared, sealed second end 534B of the inner pressure-isolating enclosure body 530, and is wrapped about the collar 536 and the collared opening 591 on the end cap 590. It is grounded by being exposed to the conductive material of the outer pressure-isolating enclosure 520 of the pressure bulkhead structure 510. Alternatively, as shown in the partial, exploded side view of FIG. 8F, the common ground contact 529D may simply be wrapped about the collared sealed second end 534B of the inner pressure-isolating enclosure body 530. It is allowed to serve its grounding function as it is placed in direct contact with the inner surface of the conductive end cap 590 when the end cap is in position (which is itself in contact with the conductive material of the outer pressure-isolating enclosure 520). The pin and inner pressure-isolating enclosure body 530 are shown in perspective view for ease of reference.

In each of the foregoing embodiments, a pressure bulkhead structure with an integrated selective electronic switch circuitry is disclosed such that the selective electronic switch circuitry is embedded within an inner pressure-isolating enclosure so as to form an integrated unit for simplified manufacture/incorporation within an outer pressure-isolating enclosure and ultimately, the macrostructure of a perforating gun select fire sub assembly. The inner pressure-isolating enclosure (and contained circuitry) is in a sense, a modular unit for easy installation, and one that protects the solid state electronics from shocks and deleterious environmental conditions. Similarly, the pressure bulkhead with the inner pressure-isolating enclosure is also a modular unit that can be installed in longer selective perforating gun toolstring assemblies. Such modular construction allows for the unit(s) to be placed in a variety of perforating gun systems while providing the safety and predictability of selective electronic switch circuitry, as well as unidirectional pressure isolation. The modular unit may be manufactured in an efficient manner, thereby providing cost-friendly options to operators of such perforating gun equipment. By including an integrated common ground contact, pin contact (line-out to next gun module) and wiring arrangement (such as a line-in/hot-wire), the disclosed pressure bulkhead structure may be compatible with all electric/resistorized detonators, electronic detonators, 50 Ohm safe detonators, and/or detonators using a fire set, an EFI, an EBW, a semiconductor bridge and/or an igniter. The disclosed pressure bulkhead structure may be compatible with all electronic RF-safe detonators.

Figure 9:
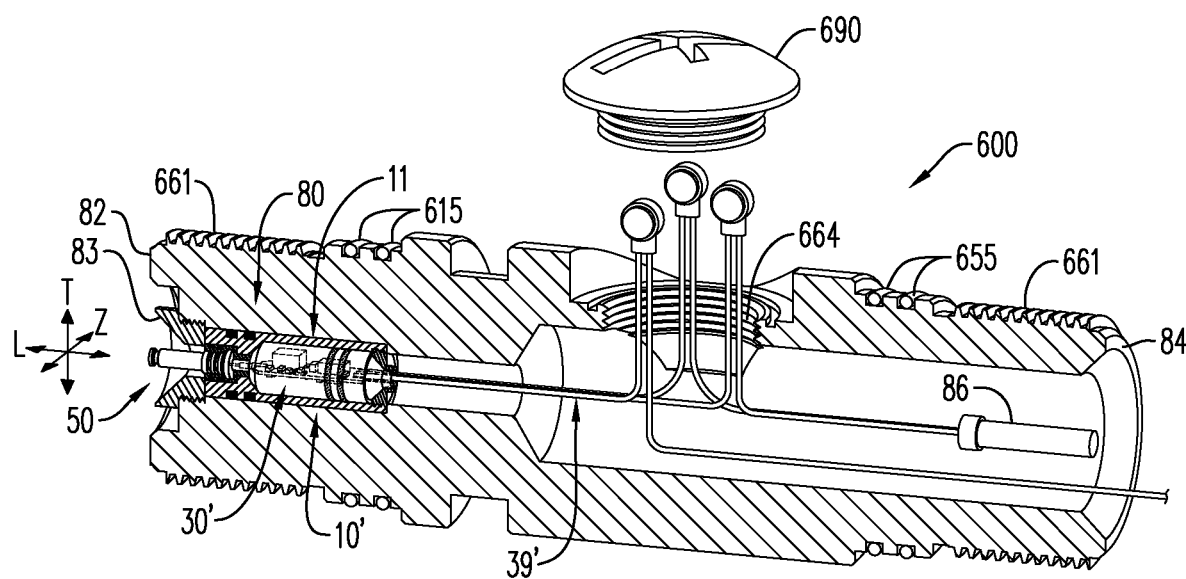
FIG. 9 is a partially exploded, side cross-sectional view of a pressure bulkhead structure with an integrated selective electronic switch circuitry, both of which are illustrated as being contained within a perforating gun select fire sub assembly according to an embodiment.

In order to more clearly put the disclosed pressure bulkhead structure 10 in context, a perforating gun select fire sub assembly 600 containing the disclosed modular pressure bulkhead structure 10' (and modular inner pressure-isolating enclosure body 30) is illustrated in FIG. 9. As can be seen in the partial cross-sectional, and exploded view of FIG. 9, the disclosed pressure bulkhead structure 10', having an outer pressure-isolating enclosure 11 and inner pressure-isolating enclosure body 30' can be seen located within the larger outer structure. The outer pressure-isolating enclosure 11 surrounds at least a portion of the pin assembly 50, the inner pressure-isolating enclosure body 30', and the retainer 60. The wiring arrangement 39' extends from the switch circuitry 37' contained in the inner pressure-isolating enclosure body 30', through a channel in the select fire sub assembly 600 to either grounding locations, other connections, or detonator technology. According to an aspect, the wiring arrangement 39' may include an additional cable that connects with grounding devices/structures, such as a ground screw, within the select fire sub assembly 600. The pressure bulkhead structure 10' may be contained at one end of the larger sub assembly 600, and particularly at region 80. The perforating gun select fire sub assembly 600, which is itself part of a larger perforating gun assembly (including a series of gun modules/perforating gun assemblies), includes a first end 82 and a second end 84 that are positioned along a generally longitudinally configured, cylindrical gun assembly body. At the first end 82, the select fire gun assembly defines an opening in which an annular threaded retainer 83 is used to hold the pressure bulkhead structure 10' in place. The annular threaded retainer 83 is held to internal threads within the assembly 600. The pin of the pin assembly 50 extends through the opening in the annular threaded retainer 83. The threaded retainer 83 which is attached to the second end 14 of the pressure bulkhead structure 11 allows the wiring arrangement 39' to pass from the selective electronic switch circuitry 37' to a detonator 86 contained in a channel of the perforating gun select fire sub assembly 600. As also seen in FIG. 9, the perforating gun select fire sub assembly 600 itself includes multiple exterior regions with circumferential grooves for holding additional pressure stabilizing devices/mechanisms 615, 655. The perforating gun select fire sub assembly 600 also includes multiple threaded portions 661 along its exterior surface for attachment of the select fire sub assembly to a larger linked gun structure. The wiring arrangement 39' extends to a region adjacent the sub assembly 600 body through opening 664 (which is itself capped by a threaded cap 690).

Figure 10:
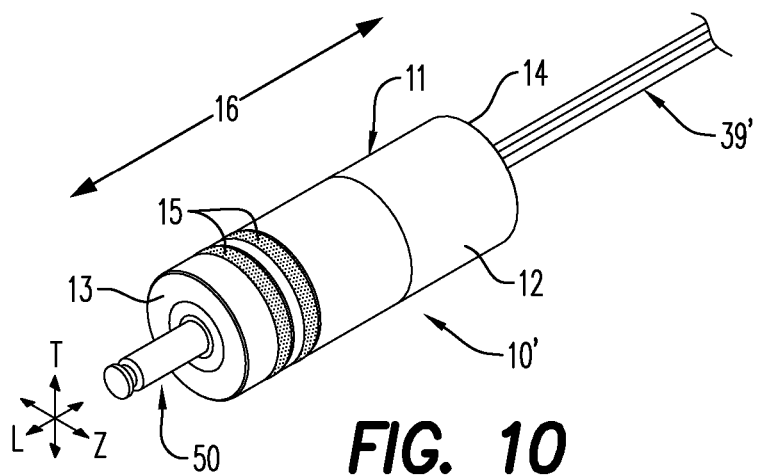
FIG. 10 is a side perspective view of a pressure isolated bulkhead structure with an integrated selective electronic switch circuitry (state of the art electrical switch) (including an inner pressure-isolating enclosure (not shown)) according to an embodiment.

For general ease of understanding, an exterior perspective view of the disclosed pressure bulkhead structure 10' can be seen in FIG. 10. The pin can be seen extending from the first end 13 of the outer pressure-isolating enclosure 11 of the pressure bulkhead structure 10, while the wiring arrangement 39' can be seen extending from the second end 14 of the outer pressure-isolating enclosure 11 of the pressure bulkhead structure 10. While the outer pressure-isolating enclosure 11 can be seen in the figure, the inner pressure-isolating enclosure 29' (and body 30') are not readily visible.

Embodiments of the disclosure are further directed to a method 1000 of manufacturing a pressure-isolating enclosure for placement as a pressure bulkhead structure of a perforating gun select fire sub assembly. The method includes providing 1010 a selective electronic switch circuitry. The selective electronic switch circuitry may be configured substantially as described hereinabove, with particular references to FIGS. 1A and 1B, so such details are not described in detail here. The method 1000 further includes coupling 1020 an electrical connector to a first end of the selective electronic switch circuitry and coupling a wiring arrangement to a second end of the selective electronic switch circuitry. The step of coupling 1020 may be performed so that the electrical connector is spaced apart from the wiring arrangement, each extending away from each other. The electrical connector may be one of a wire electrical connector (see, for instance, FIGS. 1A and 1B) or a pin contact (see, for instance, FIGS. 4-6, and 8B-8F). The wiring arrangement may include an outwardly directed detonator power line, a communications line, and a detonator ground line. A common ground contact may be connected 1030 to the selective electronic switch circuitry. The step of connecting 1030 the common ground contact includes placing the common ground contact so that it extends from the selective electronic switch circuitry through the second end, in a similar way as the wiring arrangement.

The method further includes depositing 1040 a material directly over or about the selective electronic switch circuitry to form a pressure-isolating enclosure body that is integrated with the selective electronic switch circuitry. This depositing 1040 step is performed in a manner that ensures that there are no spatial gaps between the formed pressure-isolating enclosure body and the selective electronic switch circuitry. According to an aspect, the depositing 1040 includes at least one of an injection over molding process, a 3-D printing process, and an extrusion process or a potting process. The step of depositing 1040 may include the step of injection over molding 1042 around and encompassing the selective electronic switch circuitry using one of a polymeric material, a thermoplastic material, and an elastomeric material. This forms a pressure-isolating enclosure that has a sealed first end at the first end of the selective electronic switch circuitry, and a sealed second end at the second end of the selective electronic switch circuitry. It also forms an elongated body that entirely surrounds the selective electronic switch circuitry and extends between the sealed first and second ends. This method 1000 helps to ensure that the selective electronic switch circuitry is immovable and sealed within the pressure-isolating enclosure of the pressure bulkhead structure, to help to prevent inadvertent detonation or detonation interference of the select fire sub assembly.

As can be seen from the disclosure, the pressure bulkhead structures and inner pressure-isolating enclosures require no moving parts (as in mechanical switches, or distinct fastenable retainer means) by the end user. Further such structures and enclosures allow for the use of solid state electronics in a variety of harsh environmental conditions that would normally be deleterious to such technology. For example, such pressure bulkhead structures and inner pressure-isolating enclosures provide protection to normally sensitive circuitry at conditions meeting/exceeding both industry typical RDX and HMX explosives time/temperature rating, such as temperatures exceeding 150° C., and more specifically, temperatures exceeding 375° C., and under well completion operations in which jarring, and/or physical movement are common. Furthermore, the pressure bulkhead structures and inner pressure-isolating enclosures provide for pin contacts (and pin assemblies) to be insulated from direct contact with a pressure bulkhead, while still allowing the pressure bulkhead to be electrically connected to the select fire sub assembly, the select fire sub assembly retaining device and a common ground contact. The modular units may be manufactured by a variety of methods, to create a seamless modular piece construction for use in multiple bulkhead designs, and which help protect the housed circuitry from unnecessary shocks, vibrations or other environmental conditions, which could negatively impact the functionality of electronic circuitry.

The components of the apparatus illustrated are not limited to the specific embodiments described herein, but rather, features illustrated or described as part of one embodiment can be used on or in conjunction with other embodiments to yield yet a further embodiment. It is intended that the apparatus include such modifications and variations.

While the apparatus and methods have been described with reference to specific embodiments, it will be understood by those skilled in the art that various changes may be made and equivalents may be substituted for elements thereof without departing from the scope contemplated. In addition, many modifications may be made to adapt a particular situation or material to the teachings found herein without departing from the essential scope thereof.

In this specification and the claims that follow, reference will be made to a number of terms that have the following meanings. The singular forms "a," "an" and "the" include plural referents unless the context clearly dictates otherwise. Furthermore, references to "one embodiment", "some embodiments", "an embodiment" and the like are not intended to be interpreted as excluding the existence of additional embodiments that also incorporate the recited features. Approximating language, as used herein throughout the specification and claims, may be applied to modify any quantitative representation that could permissibly vary without resulting in a change in the basic function to which it is related. Accordingly, a value modified by a term such as "about" is not to be limited to the precise value specified. In some instances, the approximating language may correspond to the precision of an instrument for measuring the value. Terms such as "first," "second," "upper," "lower" etc. are used to identify one element from another, and unless otherwise specified are not meant to refer to a particular order or number of elements.

As used herein, the terms "may" and "may be" indicate a possibility of an occurrence within a set of circumstances; a possession of a specified property, characteristic or function;

and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable, or suitable. For example, in some circumstances an event or capacity can be expected, while in other circumstances the event or capacity cannot occur—this distinction is captured by the terms "may" and "may be."

As used in the claims, the word "comprises" and its grammatical variants logically also subtend and include phrases of varying and differing extent such as for example, but not limited thereto, "consisting essentially of" and "consisting of." Where necessary, ranges have been supplied, and those ranges are inclusive of all sub-ranges therebetween. It is to be expected that variations in these ranges will suggest themselves to a practitioner having ordinary skill in the art and, where not already dedicated to the public, the appended claims should cover those variations.

Advances in science and technology may make equivalents and substitutions possible that are not now contemplated by reason of the imprecision of language; these variations should be covered by the appended claims. The patentable scope thereof is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal language of the claims.

What is claimed is:

1. A pressure bulkhead comprising:
   an outer pressure-isolating enclosure having a first end and a second end;
   a pin assembly provided at the first end of the outer pressure-isolating enclosure;
   an inner pressure-isolating enclosure having a sealed first end and a sealed second end, the inner pressure-isolating enclosure being fabricated from an electrically insulating material;
   a selective electronic switch circuitry encased within the inner pressure-isolating enclosure;
   an electrically conducting element extending from the selective electronic switch circuitry through the sealed second end of the inner pressure-isolating enclosure; wherein
   the selective electronic switch circuitry is in electrical communication with the pin assembly through the sealed first end of the inner pressure-isolating enclosure; and
   the inner pressure-isolating enclosure is configured to seal the selective electronic switch circuitry from an environment exterior to the inner pressure-isolating enclosure.

2. The pressure bulkhead of claim 1, further comprising an electrically conducting ground element extending from the selective electronic switch circuitry through the sealed second end of the inner pressure-isolating enclosure.

3. The pressure bulkhead of claim 1, wherein the selective electronic switch circuitry is adhesively fastened to or press-fitted within the inner pressure-isolating enclosure.

4. The pressure bulkhead of claim 1, wherein the selective electronic switch circuitry is in electrical communication with at least one initiator/detonator selected from the group consisting of a resistorized detonator, an electric detonator, an electronic detonator, a 50 Ohm safe detonator, an exploding foil initiator, an exploding bridgewire detonator, a semiconductor bridge, and an igniter or other pyrotechnic-based initiating device.

5. The pressure bulkhead of claim 1, wherein the sealed second end of the inner pressure-isolating enclosure is partially exposed through the second end of the outer pressure-isolating enclosure.

6. The pressure bulkhead of claim 1, further comprising a cap fastened to the sealed second end of the inner pressure-isolating enclosure.

7. The pressure bulkhead of claim 1, wherein the inner pressure-isolating enclosure comprises at least one pressure stabilizing device along an outer edge of the inner pressure-isolating enclosure to stabilize pressure within the pressure bulkhead.

8. The pressure bulkhead of claim 1, wherein:
   the selective electronic switch circuitry is in electrical communication with a pin contact protruding from the sealed first end of the inner pressure-isolating enclosure; and
   the pin contact is in electrical communication with the pin assembly.

9. The pressure bulkhead of claim 1, wherein:
   the inner pressure-isolating enclosure is retained within the outer pressure-isolating enclosure; and
   the pressure bulkhead further comprises a retainer configured to retain the inner pressure-isolating enclosure within the outer pressure-isolating enclosure.

10. The pressure bulkhead of claim 9, wherein the retainer is threadedly engaged with an inner wall edge of the outer pressure isolating enclosure.

11. The pressure bulkhead of claim 9, further comprising an electrically conducting ground element extending from the selective electronic switch circuitry through the sealed second end of the inner pressure-isolating enclosure.

12. The pressure bulkhead of claim 11, wherein electrically conducting ground element extends through the retainer.

13. A pressure bulkhead comprising:
   an enclosure body having a first end and a second end, the enclosure body including an electrically insulating material;
   a first electrical contact provided at the first end of the enclosure body;
   a second electrical contact provided at the second end of the enclosure body;
   a selective electronic switch circuitry encased within the electrically insulating material of the enclosure body, the selective electronic switch circuitry being in electrical communication with the first electrical contact and the second electrical contact;
   wherein the selective electronic switch circuitry is sealed from an environment exterior to the enclosure body.

14. The pressure bulkhead of claim 13, wherein:
   the selective electronic switch circuitry is in electrical communication with a pin contact; and
   the pin contact is in electrical communication with the first electrical contact.

15. The pressure bulkhead of claim 13, wherein the first electrical contact is a pin assembly.

16. The pressure bulkhead of claim 13, wherein the second electrical contact comprises a wire.

17. The pressure bulkhead of claim 13, wherein the second electrical contact comprises a plurality of wires.

18. The pressure bulkhead of claim 13, further comprising an electrically conducting ground element in electrical communication with the selective electronic switch circuitry, the electrically conducting ground element being provided at the second end of the enclosure body.

19. The pressure bulkhead of claim 13, wherein the selective electronic switch circuitry is in electrical communication with at least one initiator/detonator selected from the group consisting of a resistorized detonator, an electric detonator, an electronic detonator, a 50 Ohm safe detonator, an exploding foil initiator, an exploding bridgewire detonator, a semiconductor bridge, and an igniter or other pyrotechnic-based initiating device.

\* \* \* \* \*